United States Patent
Huh et al.

(10) Patent No.: US 12,306,512 B2
(45) Date of Patent: May 20, 2025

(54) LENS DEVICE AND DISPLAY ASSEMBLY INCLUDING THE SAME

(71) Applicant: SAMSUNG DISPLAY CO., LTD., Yongin-si (KR)

(72) Inventors: Su Jung Huh, Yongin-si (KR); Byeong Hee Won, Yongin-si (KR); Hyun Jin Cho, Yongin-si (KR); Beom Shik Kim, Yongin-si (KR); Sung-Chan Jo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/453,479

(22) Filed: Aug. 22, 2023

(65) Prior Publication Data
US 2024/0168360 A1    May 23, 2024

(30) Foreign Application Priority Data
Nov. 23, 2022   (KR) .................. 10-2022-0158654

(51) Int. Cl.
*G02F 1/29*    (2006.01)
(52) U.S. Cl.
CPC ..................... *G02F 1/29* (2013.01)
(58) Field of Classification Search
CPC ... G02F 1/29; G02F 1/133526; H04N 13/327; H04N 13/305; H10K 50/858
See application file for complete search history.

(56) References Cited

U.S. PATENT DOCUMENTS

| | | | |
|---|---|---|---|
| 7,515,406 B2 | 4/2009 | Kee et al. | |
| 8,508,432 B2 | 8/2013 | Shim et al. | |
| 8,611,027 B2 | 12/2013 | Bang | |
| 10,298,915 B2 | 5/2019 | Huh et al. | |
| 2014/0347725 A1 | 11/2014 | Ohbitsu | |
| 2023/0097317 A1* | 3/2023 | Motoyama | H10K 71/00 257/40 |

FOREIGN PATENT DOCUMENTS

| | | |
|---|---|---|
| CN | 112230443 | 1/2021 |
| KR | 10-1225613 B1 | 1/2013 |
| KR | 10-1341497 | 12/2013 |
| KR | 10-2014-0028704 A | 3/2014 |
| KR | 10-1400284 | 5/2014 |
| KR | 10-1551882 | 9/2015 |
| KR | 10-17 3892 | 9/2017 |
| KR | 10-2018-0046985 A | 5/2018 |
| KR | 10-2021-0132173 | 11/2021 |
| WO | WO 2015/015811 | 2/2015 |
| WO | WO 2020/257457 | 12/2020 |

* cited by examiner

*Primary Examiner* — Kevin Quarterman
(74) *Attorney, Agent, or Firm* — F. CHAU & ASSOCIATES, LLC

(57) ABSTRACT

A display assembly includes a display device having an upper surface on which an image is output, and a lens device detachably connected to the upper surface of the display device. The lens device includes a lens panel that refracts the image from the display device, and a connection layer disposed on a lower surface of the lens panel facing the display device and detachably connected to the upper surface of the display device. The upper surface of the display device includes first contact interfaces, and the connection layer includes second contact interfaces detachably connected to the first contact interfaces.

15 Claims, 24 Drawing Sheets

LENS DEVICE AND DISPLAY ASSEMBLY INCLUDING THE SAME

This application claims priority under 35 U.S.C. § 119 to Korean Patent Application No. 10-2022-0158654, filed in the Korean Intellectual Property Office (KIPO) on Nov. 23, 2022, the content of which is herein incorporated by reference in its entirety.

TECHNICAL FIELD

The disclosure relates to a display, and more particularly, to a lens device and a display assembly including the same.

DISCUSSION OF THE RELATED ART

Display devices are an important part of modern electronic devices as they often serve as a primary means for providing input and output. Accordingly, use of a display device such as a liquid crystal display (LCD) device and an organic light emitting diode (OLED) display device is increasing.

A stereoscopic image display device is a display device that provides separate left-eye and right-eye images to a viewer. This allows the viewer to perceive a three-dimensional (3D) image by binocular parallax between a left eye and a right eye.

Recently, research on a display device that provides the three-dimensional image without the need for the viewer to wear 3D glasses has been actively conducted. For example, a lenticular lens may be used to separate a left eye image and a right eye image from an output image using an array of cylindrical lenses may be used.

SUMMARY

A display assembly includes a display device having an upper surface through which an image is output, and a lens device detachably connected to the upper surface of the display device. The lens device includes a lens panel that refracts the image from the display device, and a connection layer disposed on a lower surface of the lens panel facing the display device that is detachably connected to the upper surface of the display device. The upper surface of the display device includes first contact interfaces, and the connection layer includes second contact interfaces that is detachably connected to the first contact interfaces.

The display device may have a display area outputting the image and a non-display area at least partially surrounding the display area, and the connection layer may entirely contact the upper surface of the display device without an air gap in the display area.

The display device may have a display area that outputs the image and a non-display area at least partially surrounding the display area. The lower surface of the lens panel and the connection layer may entirely contact the upper surface of the display device without an air gap, in the display area.

The second contact interfaces may be magnetically connected to the first contact interfaces.

The first contact interfaces may include recesses disposed on the upper surface of the display device, and the second contact interfaces may include protrusions disposed on a lower surface of the connection layer facing the display device that are received in the recesses, respectively.

The first contact interfaces may include protrusions disposed on the upper surface of the display device, and the second contact interfaces may include recesses disposed on a lower surface of the connection layer facing the display device and receiving the protrusions, respectively.

The display device may have a display area outputting the image and a non-display area at least partially surrounding the display area, the first contact interfaces may be disposed in the non-display area, and the second contact interfaces may at least partially overlap the first contact interfaces.

The lens panel may further include a liquid crystal layer, and a first lens array disposed between the liquid crystal layer and the connection layer. The connection layer may have substantially the same refractive index as that of the first lens array.

The lens panel may further include a second lens array. The liquid crystal layer may be disposed between the first lens array and the second lens array, and the second lens array may have a refractive index that is different from that of the first lens array.

The display device may have a display area outputting the image and a non-display area at least partially surrounding the display area, and may include a plurality of pixels arranged in a first direction and a second direction crossing the first direction in the display area. The lens panel may have an active area at least partially overlapping the display area and a peripheral area at least partially surrounding the active area and at least partially overlapping the non-display area. The lens panel may further include a lens array having lenses extending in a direction slanted at an acute angle with respect to the second direction in the active area.

The second contact interfaces of the connection layer may at least partially overlap portions of the peripheral area spaced apart from the lens array in the first direction.

The second contact interfaces of the connection layer may at least partially overlap portions of the peripheral area spaced apart from the lens array in the second direction.

The display device may store compensation vector values based on externally received user inputs, convert an input image frame based on the compensation vector values, and display the converted image frame.

The display device may display a first test frame including a predetermined pattern, and display a second test frame by shifting at least some of data pixels of the predetermined pattern by correction vector values in response to at least one first user input indicating that the displayed first test frame is distorted.

The display device may store compensation vector values according to the correction vector values, in response to a second user input indicating a pass for the displayed second test frame.

The display device may convert an input image frame based on the compensation vector values and display the converted image frame.

According to an embodiment of the disclosure, a liquid crystal lens device to be connected to a display device has an upper surface on which an image is output. The liquid crystal lens device includes a liquid crystal lens panel including a liquid crystal layer that refracts the image from the display device, and a connection layer disposed on a lower surface of the liquid crystal lens panel facing the display device, that is detachably connected to the upper surface of the display device, and the connection layer includes second contact interfaces that is detachably connected to the first contact interfaces provided on the upper surface of the display device.

The liquid crystal lens panel may further include a first lens array disposed between the liquid crystal layer and the connection layer, and the connection layer may have substantially the same refractive index as that of the lens array.

The connection layer may include a silicon-based polymer and/or an acrylic-based polymer.

The liquid crystal lens panel may further include a second lens array, the liquid crystal layer may be disposed between the first lens array and the second lens array, and the second lens array may have a refractive index that is different from that of the first lens array.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENT

Figure 1A:
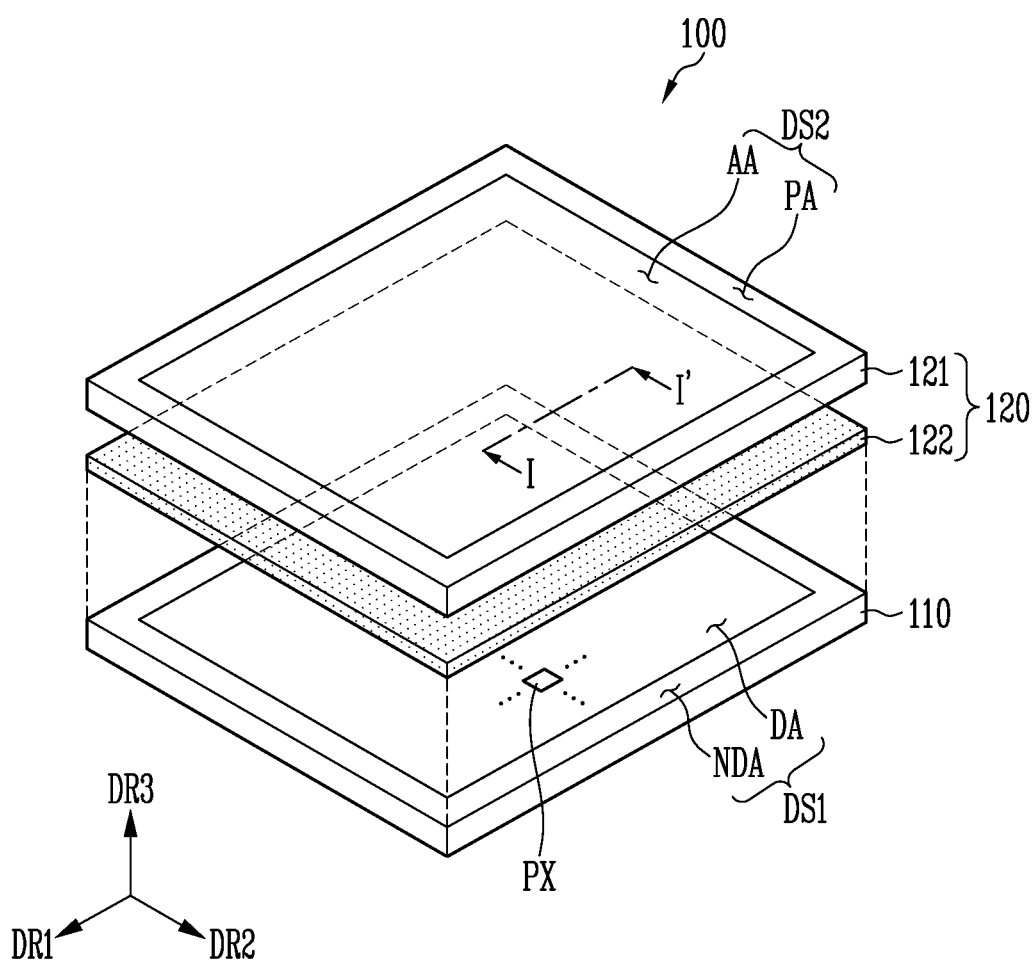
FIG. 1A is a perspective view illustrating an embodiment of a display assembly according to the disclosure.

The disclosure may be modified in various manners and have various forms. Therefore, specific embodiments will be illustrated in the drawings and will be described in detail in the specification. However, it should be understood that the disclosure is not necessarily intended to be limited to the disclosed specific forms, and the disclosure includes all modifications, equivalents, and substitutions within the spirit and technical scope of the disclosure.

Terms of "first", "second", and the like may be used to describe various components, but the components should not necessarily be limited by the terms. The terms are used for the purpose of distinguishing one component from another component. For example, without departing from the scope of the disclosure, a first component may be referred to as a second component, and similarly, a second component may also be referred to as a first component. In the following description, the singular expressions include plural expressions unless the context clearly dictates otherwise.

It should be understood that in the present application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance.

The aspects and features of the disclosure and a method of achieving them will become apparent with reference to the embodiments described in detail later together with the accompanying drawings. However, the disclosure is not necessarily limited to the embodiments disclosed below, and may be implemented in various different forms. In the following description, a case where a portion is connected to another portion includes a case where they are electrically connected to each other with another element interposed therebetween as well as a case in which they are directly connected to each other. In an embodiment of the disclosure, a term "connection" between two configurations may mean that both of an electrical connection and a physical connection are inclusively used.

Figure 1B:
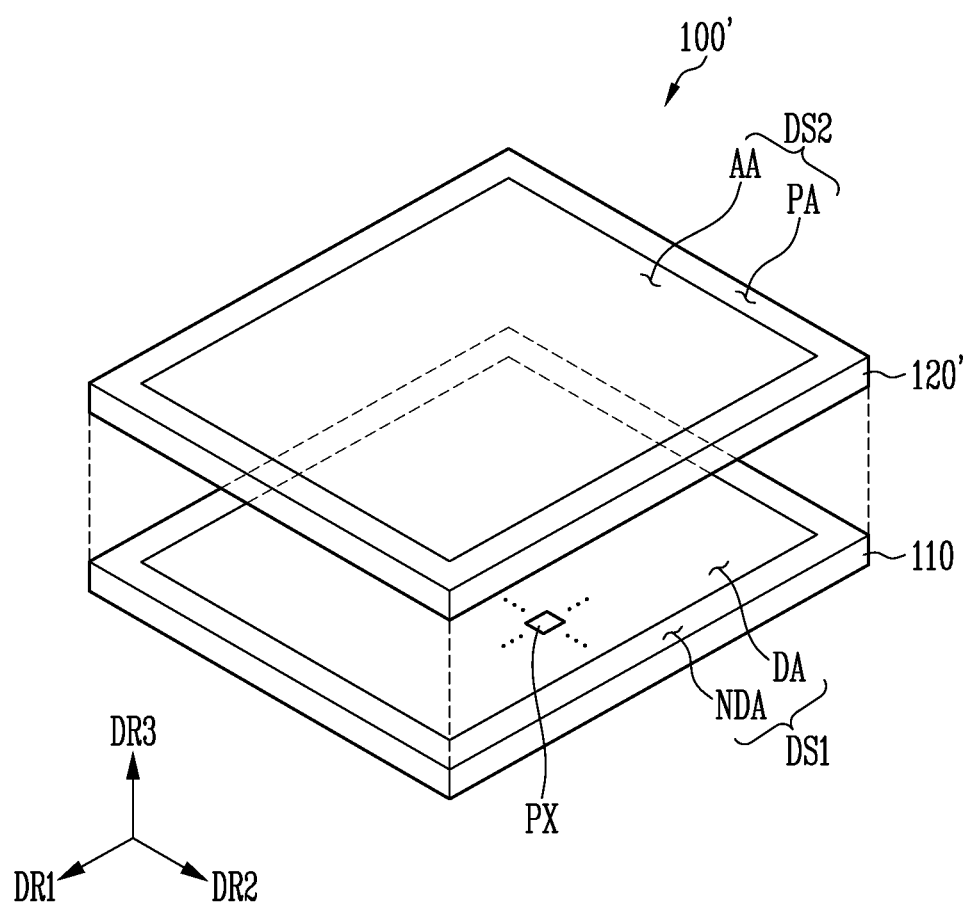
FIG. 1B is a perspective view illustrating an embodiment of the display assembly according to the disclosure.
Figure 2:
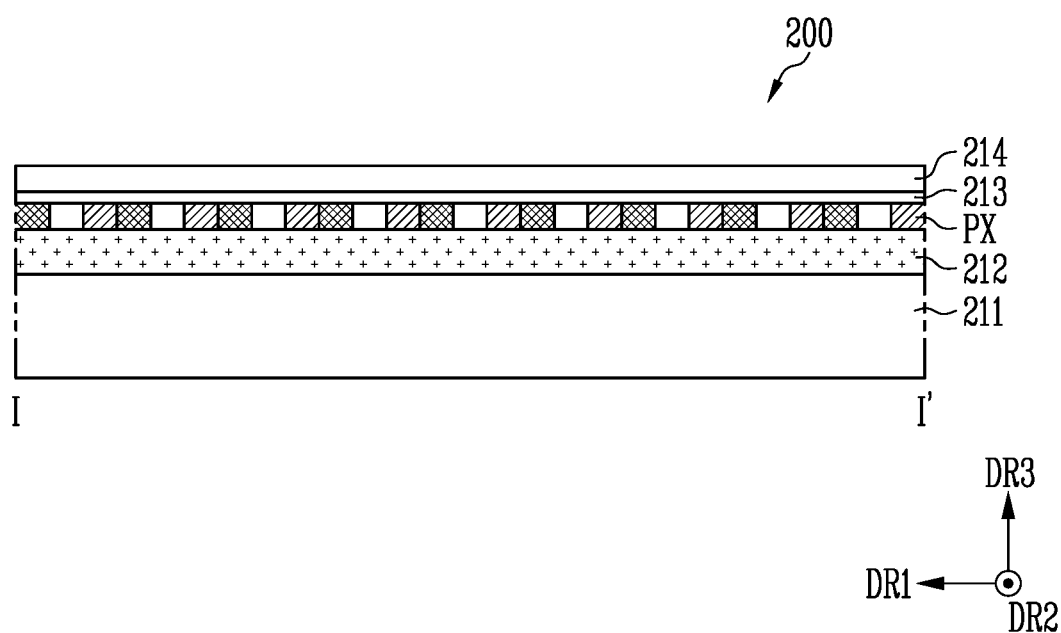
FIG. 2 is a cross-sectional view of an embodiment of the display device in I-I' of FIG. 1A.

FIG. 1A is a perspective view illustrating an embodiment of a display assembly according to the disclosure. FIG. 1B is a perspective view illustrating an embodiment of the display assembly according to the disclosure. FIG. 2 is a cross-sectional view of an embodiment of the display device in I-I' of FIG. 1A.

First, referring to FIG. 1A, the display assembly 100 may include a display device 110 and a liquid crystal lens device 120.

The display device 110 may have a first display surface DS1 extending in a first direction DR1 and a second direction DR2 crossing the first direction DR1. The first display surface DS1 may include a display area DA, which is an area where an image is output, and a non-display area NDA at least partially surrounding the display area DA. The display device 110 may include a plurality of pixels PX each emitting light of any one color, and the plurality of pixels PX may be arranged in the display area DA. For example, the pixels PX arranged along the first direction DR1 may form a pixel row, and the pixels PX arranged along the second direction DR2 may form a pixel column.

In embodiments, the display device 110 may be a light emitting display layer. For example, the display device 110 may include an organic light emitting display device, a quantum dot display device, and/or a micro LED display device.

In embodiments, the display device 110 may include a base layer 211, a circuit layer 212, a light emitting element layer 213, and an encapsulation layer 214, like the display device 200 shown in FIG. 2.

The base layer 211 may include a substrate. The substrate may include a glass substrate, an organic/inorganic composite substrate, or the like. The base layer 211 may include a synthetic resin layer. The synthetic resin layer may include a thermosetting resin. The base layer 211 may have a multilayer structure. For example, the base layer 211 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. In embodiments, each of the first and second synthetic resin layers may include an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, a perylene-based resin, and/or the like.

The circuit layer 212 may be disposed on the base layer 211. The circuit layer 212 may include a plurality of layers for driving the light emitting element layer 213, such as semiconductor patterns, conductive patterns, signal lines, and insulating layers. For example, the semiconductor patterns and the conductive patterns may include pixel circuits for driving the light emitting elements of the light emitting element layer 213, and such pixel circuits may be controlled through signal lines.

The light emitting element layer 213 may be disposed on the circuit layer 212. The light emitting element layer 213 may include light emitting elements as a plurality of pixels PX. For example, the light emitting element layer 213 may include an organic light emitting material, a quantum dot, and/or a micro LED.

The encapsulation layer 214 may be disposed on the light emitting element layer 213 to protect the various elements of the display device 200, such as the light emitting element layer 213, from an external environment. The encapsulation layer 214 may include inorganic layers and at least one organic layer. For example, the encapsulation layer 214 may include an inorganic layer, an organic layer, and an inorganic layer that are sequentially stacked. The inorganic layers may protect the light emitting element layer 213 from moisture and oxygen, and the organic layer may protect the light emitting element layer 213 from a foreign substance such as a dust particle.

Referring to FIG. 1A again, a lens device, which may be provided in a form of the liquid crystal lens device 120, is disposed on the display device 110. The liquid crystal lens device 120 may include a liquid crystal lens panel 121 and a connection plate 122.

The liquid crystal lens panel 121 refracts an image output from the display device 110. The liquid crystal lens panel 121 may have a second display surface DS2 extending in the first direction DR1 and the second direction DR2 crossing the first direction DR1. The second display surface DS2 may include an active area AA at least partially overlapping the display area DA and a peripheral area PA at least partially surrounding the active area. The liquid crystal lens panel 121 may refract and output an image output in the third direction DR3 from the display area DA of the display device 110 in the active area AA. In embodiments, the liquid crystal lens panel 121 may include a liquid crystal layer disposed in the active area AA, and control (or adjust) refraction (for example, a refractive index) for an image by driving the liquid crystal layer.

According to an embodiment of the disclosure, a connection layer, which may be provided in a form such as the connection plate 122, is disposed between the liquid crystal lens panel 121 and the display device 110. As shown in FIG. 1A, the connection plate 122 may be entirely disposed along a lower surface of the liquid crystal lens panel 121 to support the liquid crystal lens panel 121.

According to an embodiment of the disclosure, the connection plate 122 is detachably connected to the first display surface DS1 of the display device 110. When the liquid crystal lens device 120 is separated from the display device 110, light generated from the display device 110 may be shown to a user as a two-dimensional image through the first display surface DS1. When the liquid crystal lens device 120 is assembled to the display device 110, the light generated from the display device 110 may be provided to the liquid crystal lens device 120 through the first display surface DS1, may pass through the liquid crystal lens device 120, and may be shown to the user as a three-dimensional image through the second display surface DS2.

The first display surface DS1 of the display device 110 may have first contact interfaces, and a lower surface of the connection plate 122 facing the first display surface DS1 may include second contact interfaces that is detachably connected to the first contact interfaces. In embodiments, the first contact interfaces of the display device 110 and the second contact interfaces of the connection plate 122 may have interlocked shapes in an alternate or staggered manner. This is described in detail with reference to FIGS. 3A to 3D.

As such, the connection plate 122 extends along the first and second directions DR1 and DR2 and is entirely disposed on the lower surface of the liquid crystal lens panel 121. The connection plate 122 is disposed on a path through which the light generated from the display device 110 reaches the liquid crystal lens panel 121. The connection plate 122 may be transparent to pass the light therethrough. This is described in more detail with reference to FIG. 4.

Referring to FIG. 1B, a display assembly 100' may include the display device 110 and a liquid crystal lens device 120'. Differently from the liquid crystal lens device 120 of FIG. 1A, the liquid crystal lens device 120' might not include a structure such as the connection plate 122 of FIG. 1A disposed on a lower surface thereof. The liquid crystal lens device 120' may include the liquid crystal lens panel 121 of FIG. 1A, and may include the second contact interfaces as a connection layer from one of the components of the liquid crystal lens panel 121. The second contact interfaces may be formed detachably from the first contact interfaces of the display device 110. This is described in more detail with reference to FIG. 3E.

FIGS. 3A to 3D are cross-sectional views illustrating embodiments of the display assembly of FIG. 1A.

Figure 3A:
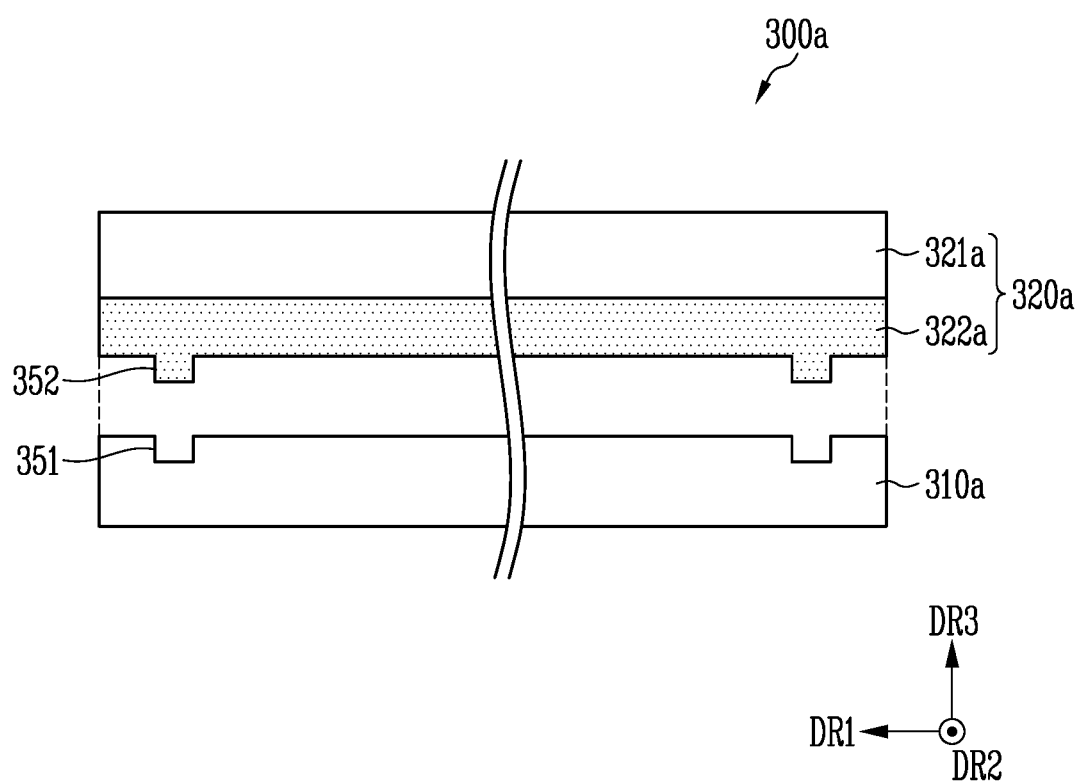
FIGS. 3A to 3D are cross-sectional views illustrating embodiments of the display assembly of FIG. 1A.

Referring first to FIG. 3A, a display assembly 300a may include a display device 310a and a liquid crystal lens device 320a. The liquid crystal lens device 320a may include a liquid crystal lens panel 321a and a connection plate 322a. The display device 310a, the liquid crystal lens panel 321a, and the connection plate 322a are configured similarly to the display device 110, the liquid crystal lens panel 121, and the connection plate 122 described with reference to FIG. 1A, respectively. Hereinafter, to the extent that an element is not described in detail, it may be assumed that the element is at least similar to corresponding elements that are disclosed elsewhere within the present disclosure.

The display device 310a may include one or more recesses 351 as the first contact interfaces on an upper surface (for example, DS1 of FIG. 1A) thereof. The connection plate 322a of the liquid crystal lens device 320a may include one or more protrusions 352 corresponding to the recesses 351 as the second contact interfaces on a lower surface thereof. The one or more recesses 351 may have shapes capable of receiving the one or more protrusions 352 when the connection plate 322a is assembled to the display device 310a.

Figure 3B:
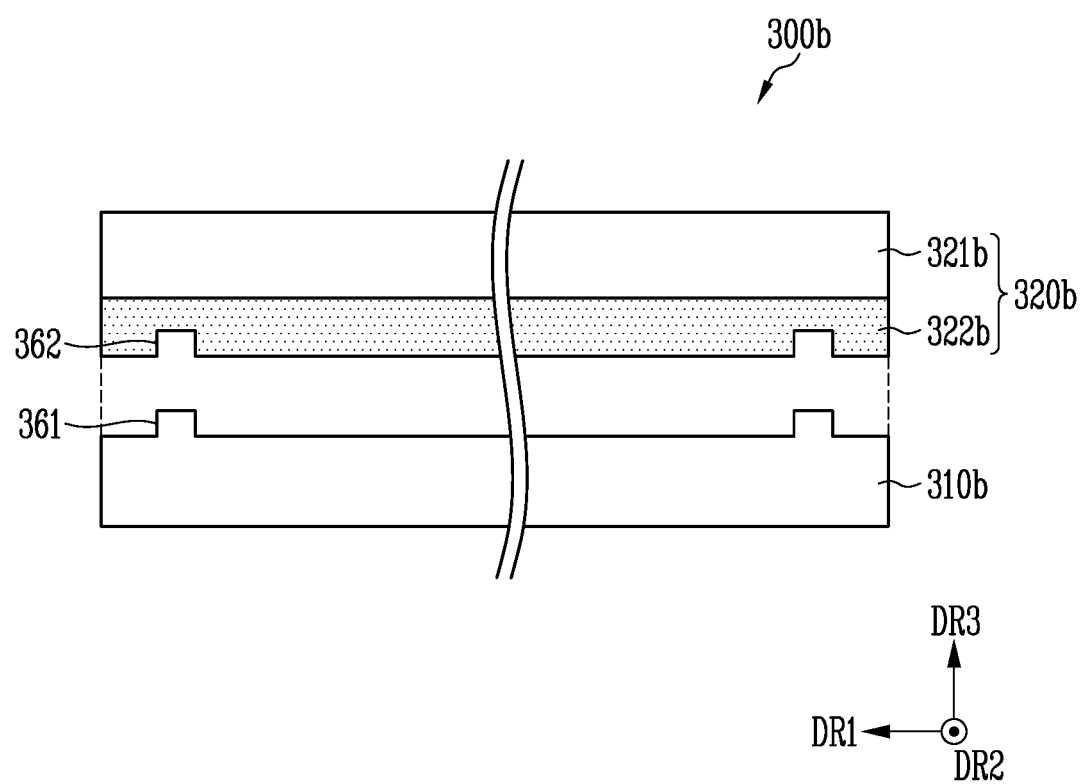

Referring to FIG. 3B, a display assembly 300*b* may include a display device 310*b* and a liquid crystal lens device 320*b*. The liquid crystal lens device 320*b* may include a liquid crystal lens panel 321*b* and a connection plate 322*b*. The display device 310*b*, the liquid crystal lens panel 321*b*, and the connection plate 322*b* may be configured similarly to the display device 110, the liquid crystal lens panel 121, and the connection plate 122 described with reference to FIG. 1A, respectively. Hereinafter, to the extent that an element is not described in detail, it may be assumed that the element is at least similar to corresponding elements that are disclosed elsewhere within the present disclosure.

The display device 310*b* may include one or more protrusions 361 as the first contact interfaces on an upper surface thereof. The connection plate 322*b* may include one or more recesses 362 corresponding to the protrusions 361 as the second contact interfaces on a lower surface thereof. The one or more recesses 362 may have shapes capable of receiving the one or more protrusions 361.

Figure 3C:
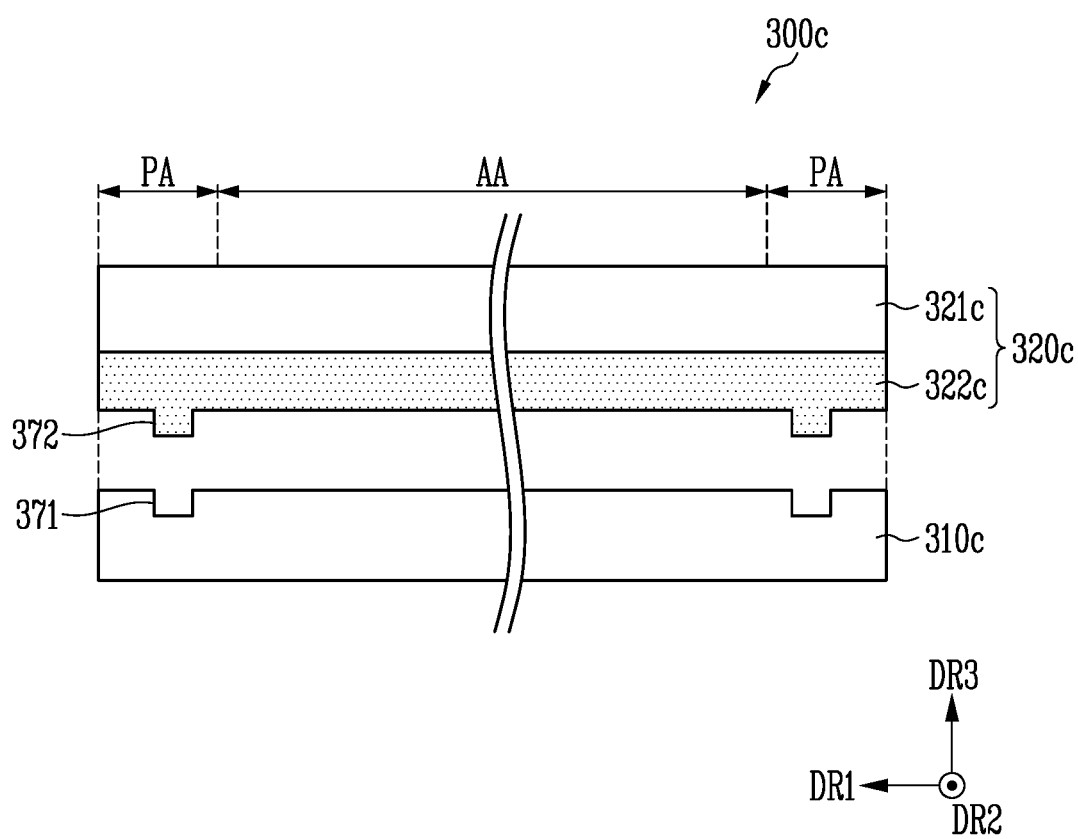

Next, referring to FIG. 3C, a display assembly 300*c* may include a display device 310*c* and a liquid crystal lens device 320*c*. The liquid crystal lens device 320*c* may include a liquid crystal lens panel 321*c* and a connection plate 322*c*. The display device 310*c*, the liquid crystal lens panel 321*c*, and the connection plate 322*c* may be configured similarly to the display device 110, the liquid crystal lens panel 121, and the connection plate 122 described with reference to FIG. 1A, respectively. Hereinafter, to the extent that an element is not described in detail, it may be assumed that the element is at least similar to corresponding elements that are disclosed elsewhere within the present disclosure.

As described with reference to FIG. 1A, the liquid crystal lens device 320*c* may have an active area AA at least partially overlapping the display area DA (refer to FIG. 1A) and a peripheral area PA at least partially overlapping the non-display area NDA (refer to FIG. 1A). One or more recesses 371 of the display device 310*c* may be disposed in the peripheral area PA or the non-display area NDA. In this case, since one or more protrusions 372 of the connection plate 322*c* at least partially overlap the recesses 371, the one or more protrusions 372 may be similarly disposed in the peripheral area PA or the non-display area NDA.

Figure 3D:
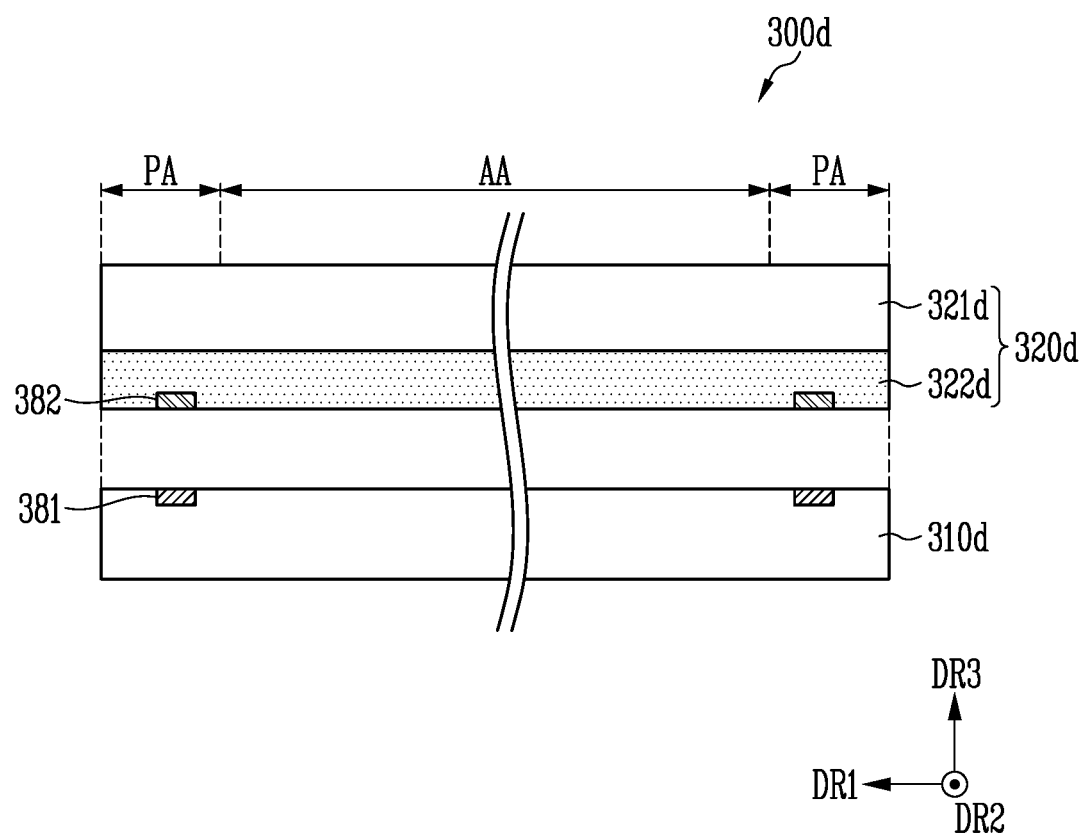

Referring to FIG. 3D, a display assembly 300*d* may include a display device 310*d* and a liquid crystal lens device 320*d*. The liquid crystal lens device 320*d* may include a liquid crystal lens panel 321*d* and a connection plate 322*d*. The display device 310*d*, the liquid crystal lens panel 321*d*, and the connection plate 322*d* may be configured similarly to the display device 110, the liquid crystal lens panel 121, and the connection plate 122 described with reference to FIG. 1A. Hereinafter, to the extent that an element is not described in detail, it may be assumed that the element is at least similar to corresponding elements that are disclosed elsewhere within the present disclosure.

The display device 310*d* and the connection plate 322*d* may include first and second connection members 381 and 382 that at least partially overlap each other and are attracted to each other by magnetic force in the peripheral area PA. In embodiments, one or more first connection members 381 included in the display device 310*d* may include a magnetic material, and one or more second connection members 382 included in the connection plate 322*d* may include a material such as iron attracted by the magnetic material of the first connection members 381, or vice versa.

In embodiments, the first connection member 381 of the display device 310*d* may be provided in an area adjacent to the recess 351, the protrusion 361, and/or the recess 371 of FIGS. 3A to 3C. The second connection member 382 of the connection plate 322*d* may be provided in an area adjacent to the protrusion 352, the recess 362, and/or the protrusion 372 of FIGS. 3A to 3C.

As such, the display device 110 of FIG. 1A may include various first contact interfaces on the first display surface DS1, and the connection plate 122 of FIG. 1A may include second contact interfaces corresponding to the first contact interfaces on the lower surface thereof.

Figure 3E:
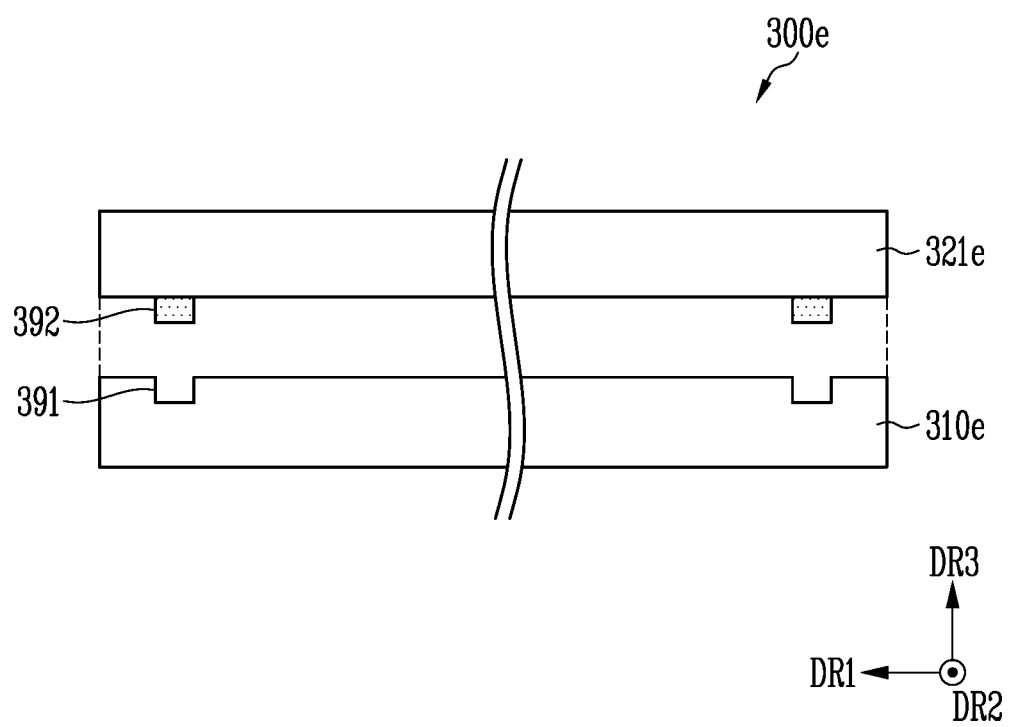
FIG. 3E is a cross-sectional view illustrating an embodiment of the display assembly of FIG. 1B.

FIG. 3E is a cross-sectional view illustrating an embodiment of the display assembly of FIG. 1B.

Referring to FIG. 3E, a display assembly 300*e* may include a display device 310*e* and a liquid crystal lens panel 321*e*. The display device 310*e* and the liquid crystal lens panel 321*e* are configured similarly to the display device 110 and the liquid crystal lens device 120' described with reference to FIG. 1B, respectively. Hereinafter, to the extent that an element is not described in detail, it may be assumed that the element is at least similar to corresponding elements that are disclosed elsewhere within the present disclosure.

Similarly to the display device 310*a* of FIG. 3A, the display device 310*e* may include one or more recesses 391 as the first contact interfaces on an upper surface thereof. The liquid crystal lens panel 321*e* may include one or more protrusions 392 corresponding to the recesses 391 as the second contact interfaces on a lower surface thereof. The lower surface of the liquid crystal lens panel 321*e* and the protrusions 392 may entirely contact the upper surface of the display device 310*e*.

In embodiments, the protrusions 392 may protrude from a lower substrate (refer to SUB1 of FIG. 4) of the liquid crystal lens panel 321*e*. In embodiments, the liquid crystal lens panel 321*e* may further include a cover layer disposed under the lower substrate to protect the liquid crystal lens panel 321*e*, and the protrusions 392 may protrude from the corresponding cover layer.

In embodiments, the liquid crystal lens panel 321*e* may include the second contact interfaces described with reference to FIGS. 3B, 3C, and 3D on the lower surface thereof. In this case, the display device 310*e* may include the first contact interfaces described with reference to FIGS. 3B, 3C, and 3D on the upper surface thereof.

Figure 4:
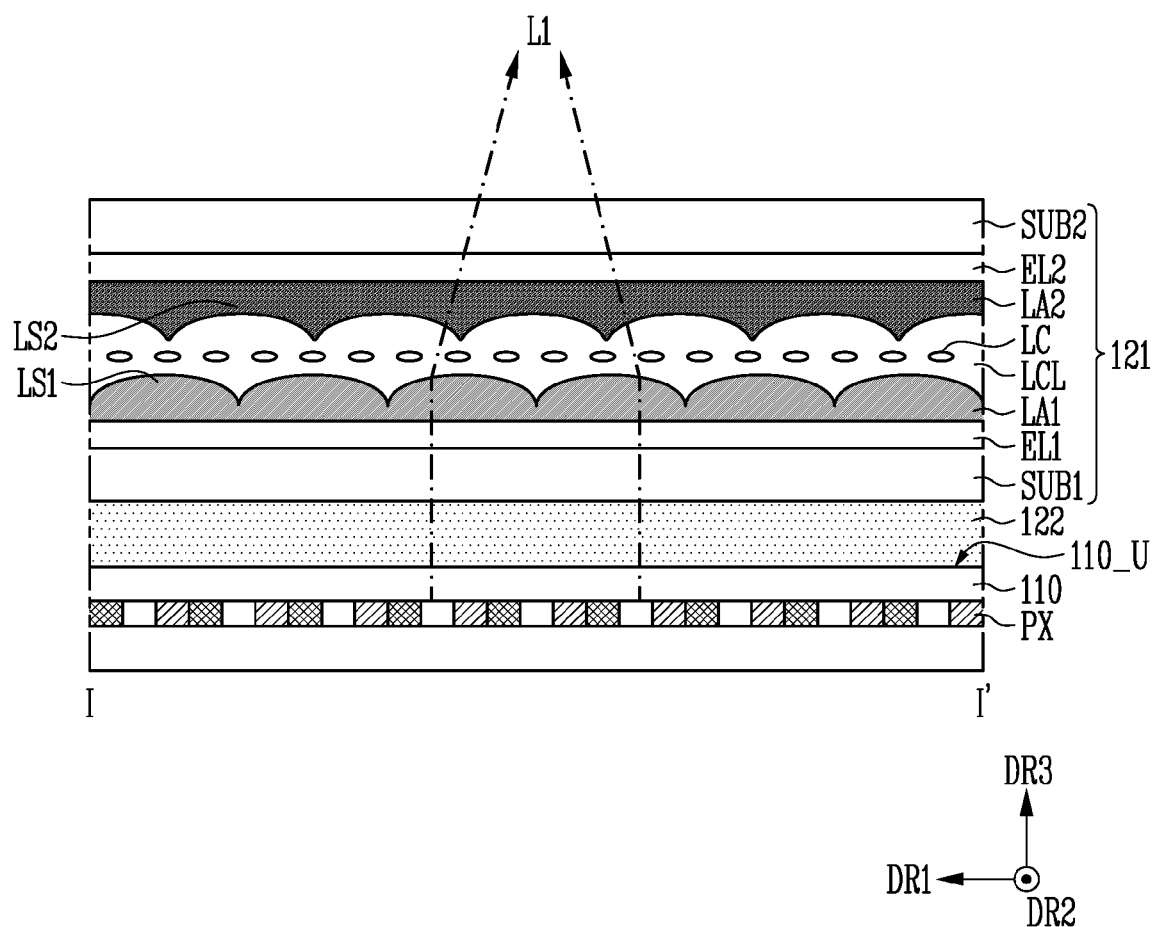
FIGS. 4 and 5 are cross-sectional views of an embodiment of the display assembly in I-I' of FIG. 1A.
Figure 5:
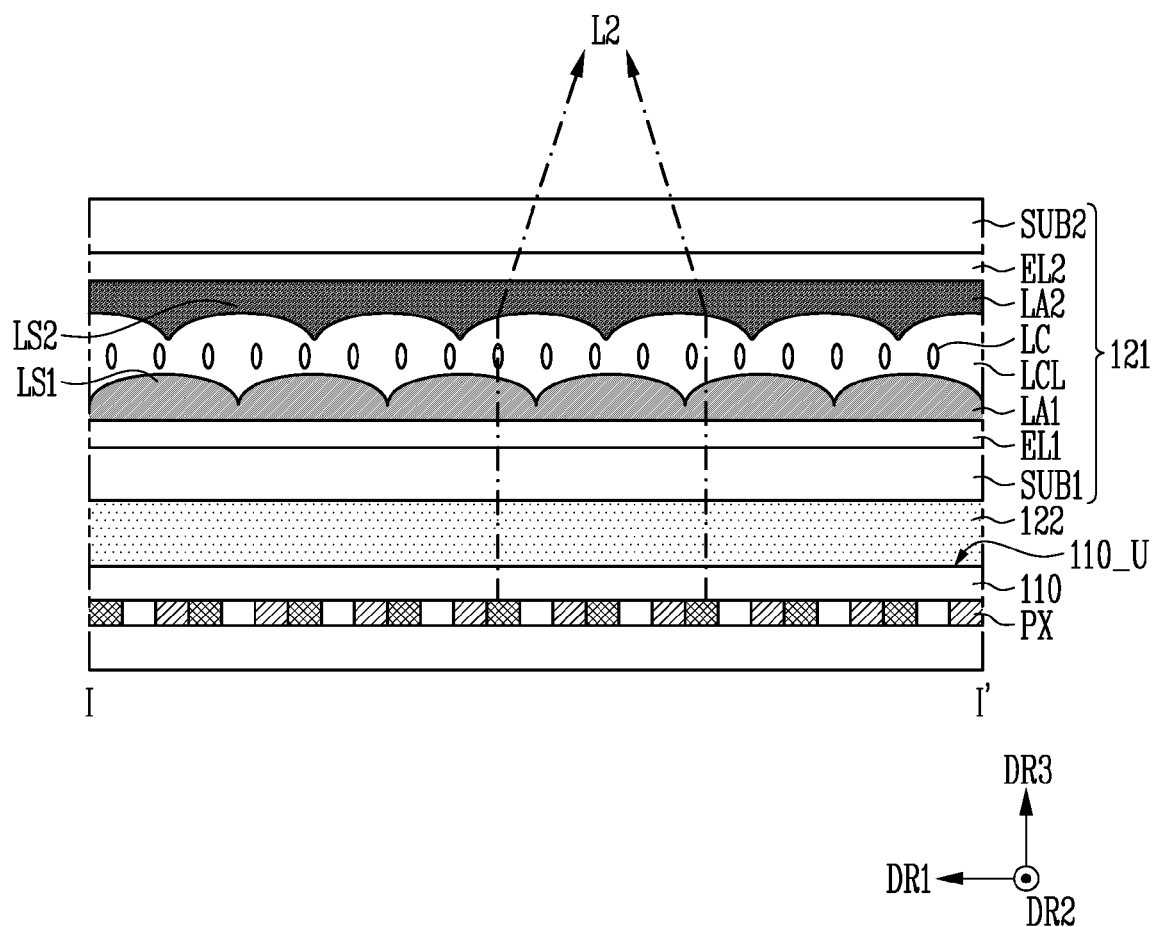

FIGS. 4 and 5 are cross-sectional views of an embodiment of the display assembly in I-I' of FIG. 1A. In FIG. 4, liquid crystal molecules LC are shown when an electric field is not formed between an upper electrode and a lower electrode of the liquid crystal lens panel 121. In FIG. 5, liquid crystal molecules LC are shown when an electric field is formed between the upper electrode and the lower electrode of the liquid crystal lens panel 121.

First, referring to FIG. 4, the liquid crystal lens panel 121 may include a liquid crystal layer LCL to control refraction of the light generated from the display device 110. In embodiments, the liquid crystal lens panel 121 may include the lower substrate SUB1, a lower electrode layer EL1, a lower lens array LA1, the liquid crystal layer LCL, an upper lens array LA2, an upper electrode layer EL2, and an upper substrate SUB2.

Each of the lower substrate SUB1 and the upper substrate SUB2 may include a transparent insulating material. Each of the lower substrate SUB1 and the upper substrate SUB2 may include an organic material. As an example, each of the lower substrate SUB1 and the upper substrate SUB2 may include an inorganic material.

The lower electrode layer EL1 may be disposed on the lower substrate SUB1. The lower electrode layer EL1 may have electrical conductivity by including a metal material, a transparent conductive material, and/or various other conductive materials. The lower electrode layer EL1 may be formed as a single layer or multiple layers.

The lower lens array LA1 may be disposed on the lower electrode layer EL1. The lower lens array LA1 may include first lenses LS1 of convex shapes extending in the second direction DR2 or in a direction slanted from the second direction DR2. In embodiments, the first lenses LS1 may include an optically anisotropic material. Each of the first lenses LS1 may at least partially overlap a predetermined number of pixels PX, and may refract light L1 generated from the corresponding pixels PX.

The upper electrode layer EL2 may be disposed under the upper substrate SUB2. The upper electrode layer EL2 may have electrical conductivity by including a metal material, a transparent conductive material, and/or various other conductive materials. The upper electrode layer EL2 may be formed as a single layer or multiple layers.

The upper lens array LA2 may be disposed under the upper electrode layer EL2. The upper lens array LA2 may include second lenses LS2 of concave shapes extending in the second direction DR2 or in a direction slanted from the second direction DR2. In embodiments, the second lenses LS2 may extend in substantially the same direction as the first lenses LS1. In embodiments, the second lenses LS2 may include an optically anisotropic material. Each of the second lenses LS2 may at least partially overlap the same number of pixels PX as each of the first lenses LS1, and may at least partially overlap two of the first lenses LS1. For example, each of the second lenses LS2 may have the same width as each of the first lenses LS1, and may be shifted and disposed in the first direction DR1 when compared to each of the first lenses LS1. For example, each of the second lenses LS2 may have a central optical axis different from that of each of the first lenses LS1, and may be shifted and disposed in the first direction DR1 by half a corresponding width. Accordingly, the second lenses LS2 may refract the light L1 generated from the pixels PX differently from the first lenses LS1.

The liquid crystal layer LCL may be disposed between the lower lens array LA1 and the upper lens array LA2. The liquid crystal layer LCL may include liquid crystal molecules LC having an alignment direction set by a lower layer (for example, the lower lens array LA1) and/or an upper layer (for example, the upper lens array LA2) contacting the liquid crystal layer LCL.

Since power is not applied to the lower electrode layer EL1 and the upper electrode layer EL2, an electric field might not be formed between the lower electrode layer EL1 and the upper electrode layer EL2. In this case, the light L1 from the display device 110 may be mainly refracted by the first lenses LS1 of the lower lens array LA1. For example, the light L1 may be refracted by the first lenses LS1 due to a difference between a refractive index of the lower lens array LA1 and a refractive index of the liquid crystal layer LCL. For example, the refractive index of the liquid crystal layer LCL may be different from that of the lower lens array LA1 due to the alignment direction of the liquid crystal molecules LC.

Since power is applied to the lower electrode layer EL1 and the upper electrode layer EL2, an electric field may be formed between the lower electrode layer EL1 and the upper electrode layer EL2. Referring to FIG. 5, when power is applied to the lower electrode layer EL1 and the upper electrode layer EL2, long axes of the liquid crystal molecules LC may be arranged along a corresponding electric field direction. In this case, light L2 from the display device 110 may be mainly refracted by the second lenses LS2 of the upper lens array LA2. For example, since the long axes of the liquid crystal molecules LC are arranged along the electric field direction, a difference between the refractive index of the liquid crystal layer LCL and the refractive index of the lower lens array LA1 may be minimized or reduced. In contrast, a difference between the refractive index of the liquid crystal layer LCL and a refractive index of the upper lens array LA2 may be increased. Accordingly, the light L2 from the display device 110 may be mainly refracted by the second lenses LS2 of the upper lens array LA2.

As such, the liquid crystal lens panel 121 may control the liquid crystal layer LCL through the lower electrode layer EL1 and the upper electrode layer EL2, to selectively perform refraction using the lower lens array LA1 and refraction using the lower lens array LA1. Accordingly, high quality of 3D image may be output.

According to an embodiment of the disclosure, the connection plate 122 entirely contacts an upper surface 110_U of the display device 110 without an air gap in the display area DA of FIG. 1A. When an air gap exists between the connection plate 122 and the display device 110, the air gap has a relatively low refractive index (for example, 1.0), and thus the light L1 and L2 generated from the display device 110 may be refracted by the air gap. This may mean that a direction of the light L1 and L2 generated from the display device 110 is different from an intended direction, and thus reliability of an image visually recognized by the user may be reduced.

According to an embodiment of the disclosure, the connection plate 122 entirely contacts the upper surface 110_U of the display device 110 without an air gap. Accordingly, the light L1 and L2 generated from the display device 110 might not be refracted or angled on the upper surface 110_U of the display device 110 and may be transmitted toward the liquid crystal lens panel 121 in an intended direction. This may minimize or at least reduce distortion of the light L1 and L2 output from the display device 110. Accordingly, while the liquid crystal lens device 120 may be assembled detachably from the display device 110, an image output through the liquid crystal lens device 120 may have increased reliability.

In a case of the display assembly 100' of FIG. 1B, as described with reference to FIG. 3E, the liquid crystal lens device 120' may include the second contact interfaces as the connection layer without a component such as a plate on a lower surface thereof. In this case, the lower surface of the liquid crystal lens device 120' and the second contact interfaces may entirely contact the upper surface 110_U of the display device 110 without an air gap. Accordingly, the light generated from the display device 110 may be transmitted toward the liquid crystal lens device 120' in an intended direction without being refracted or tilted on the upper surface 110_U of the display device 110.

In embodiments, the connection plate 122 may have substantially the same refractive index as that of the lower lens array LA1. In embodiments, a refractive index of each of the connection plate 122 and the lower lens array LA1 may be selected from a range of about 1.5 to about 1.8. This may allow the light L1 and L2 generated from the display device 110 to be transmitted to convex surfaces of the first lenses LS1 of the lower lens array LA1 in an intended direction. Accordingly, an image output through the liquid crystal lens device 120 may have further increased reliability.

In embodiments, the upper lens array LA2 may have a refractive index that is different from that of the lower lens array LA1. Accordingly, the light L1 and L2 output from the display device 110 may be selectively refracted by any one of the lower lens array LA1 and the upper lens array LA2 as the liquid crystal layer LCL is controlled as described with reference to FIGS. 4 and 5. In embodiments, the refractive index of the upper lens array LA2 may be selected from a range of about 1.4 to about 1.6. As such, the connection plate 122 may have a refractive index that is different from that of the upper lens array LA2.

The connection plate 122 includes a transparent material. In embodiments, the connection plate 122 may include an optically clear adhesive material and/or film that is adhered to the liquid crystal lens panel 121. In embodiments, the connection plate 122 may include a silicon-based polymer and/or an acrylic-based polymer. For example, the connection plate 122 may include polyethyleneterephthalate, polydimethylsiloxane, and/or polymethyl methacrylate (PMMA).

Figure 6:
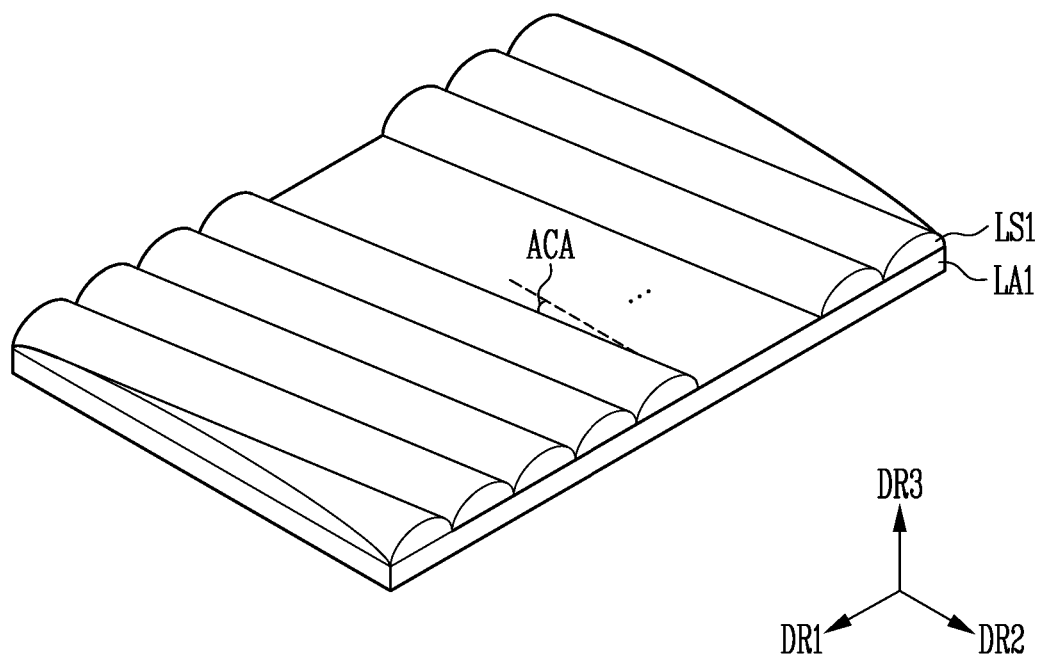
FIG. 6 is a perspective view illustrating an embodiment of a lower lens array of a liquid crystal lens panel.

FIG. 6 is a perspective view illustrating an embodiment of the lower lens array of the liquid crystal lens panel.

Referring to FIG. 6, the lower lens array LA1 may include the first lenses LS1 in the active area AA. The first lenses LS1 is arranged in the first direction DR1, and each of the first lenses LS1 extends in a direction slanted by a specific acute angle ACA with respect to the second direction DR2. As such, since the first lenses LS1 are slanted with respect to the second direction DR2, moire may be prevented from being visually recognized in an image output from the display assembly 100 when the first lenses LS1 are connected to the display device 110 of FIGS. 1A and 1B. For example, since the first lenses LS1 are slanted with respect to the second direction DR2, moire that may be formed along the second direction DR2 may be prevented.

As described with reference to FIGS. 4 and 5, the upper lens array LA2 may include the second lenses LS2 extending in the same direction as the first lenses LS1, having the same widths as the first lenses LS1, and shifted in the first direction DR1 compared to the first lenses LS1.

FIGS. 7A to 7D are plan views illustrating embodiments of the connection plate of FIG. 1A.

Figure 7A:
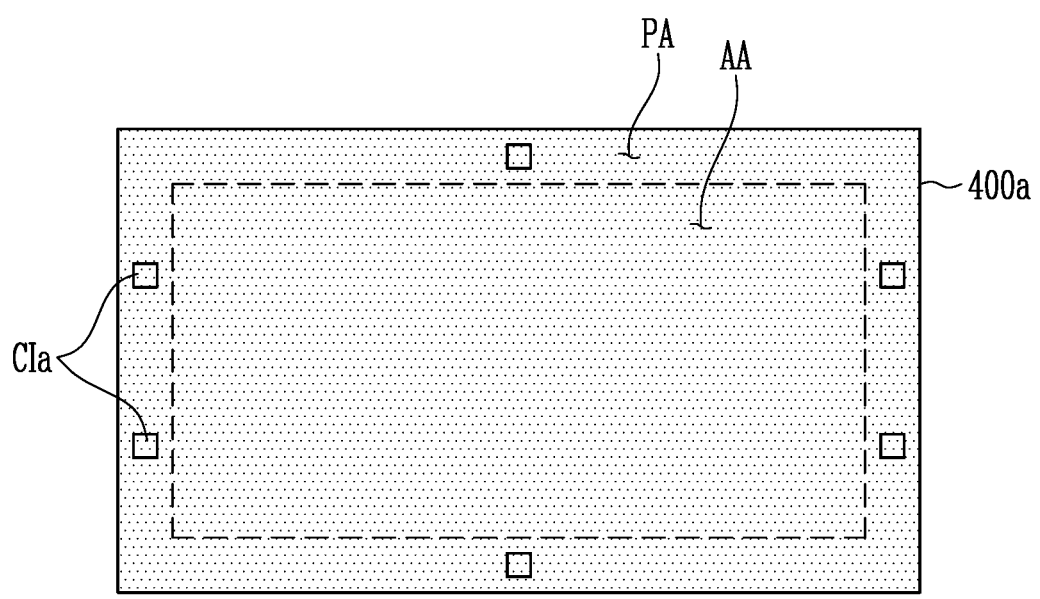
FIGS. 7A to 7D are plan views illustrating embodiments of a connection plate of FIG. 1A.

First, referring to FIG. 7A, a connection plate 400a may include second contact interfaces CIa in portions of a peripheral area PA1 spaced apart from the active area AA in the first direction DR1. As shown in FIG. 6, the first lenses LS1 extend in the direction slanted by the acute angle ACA with respect to the second direction DR2. Considering such shapes, when the second contact interfaces CIa are disposed in portions (left and right portions) of the peripheral area PA1 spaced apart from the lower lens array LA1 in the first direction DR1, the first lenses LS1 may be efficiently aligned in the display device 110.

Additionally, the connection plate 400a may also include the second contact interfaces CIa in portions of the peripheral area PA1 spaced apart from the active area AA in the second direction DR2.

The display device 110 may include the first contact interfaces detachably connected to the second contact interface CIa.

Accordingly, when the liquid crystal lens device 120 (refer to FIG. 1A) including the connection plate 400a is connected to the display device 110, the liquid crystal lens device 120 may be efficiently aligned in the display device 110.

Figure 7B:
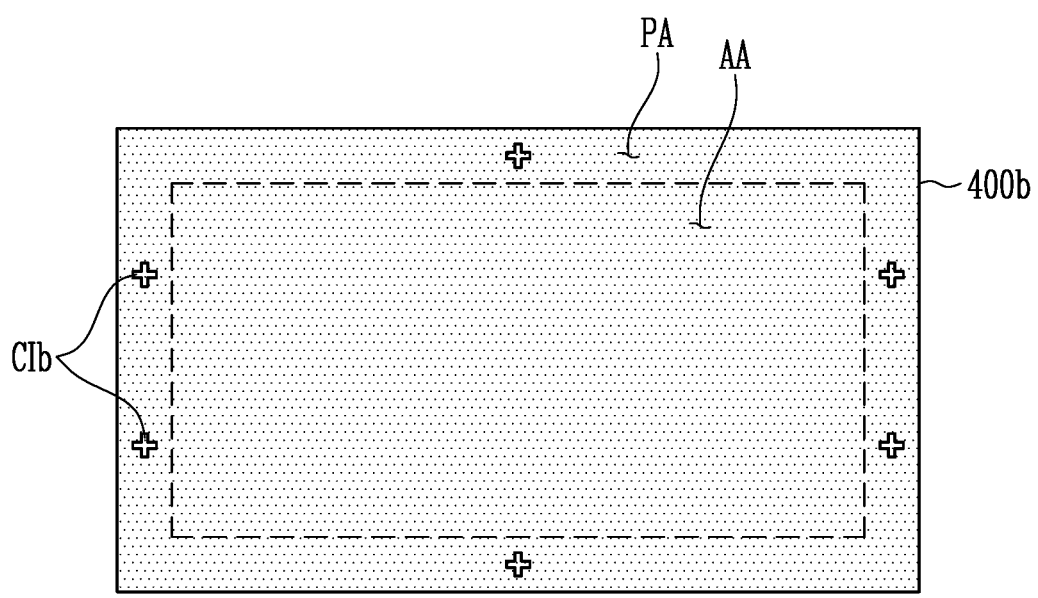
Figure 7B:
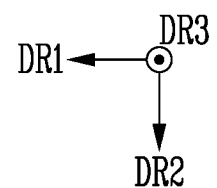

Next, referring to FIG. 7B, a connection plate 400b may include "+" shape of second contact interfaces CIb. Such a shape may allow the connection plate 400b to be effectively fixed to the display device 110.

Figure 7C:
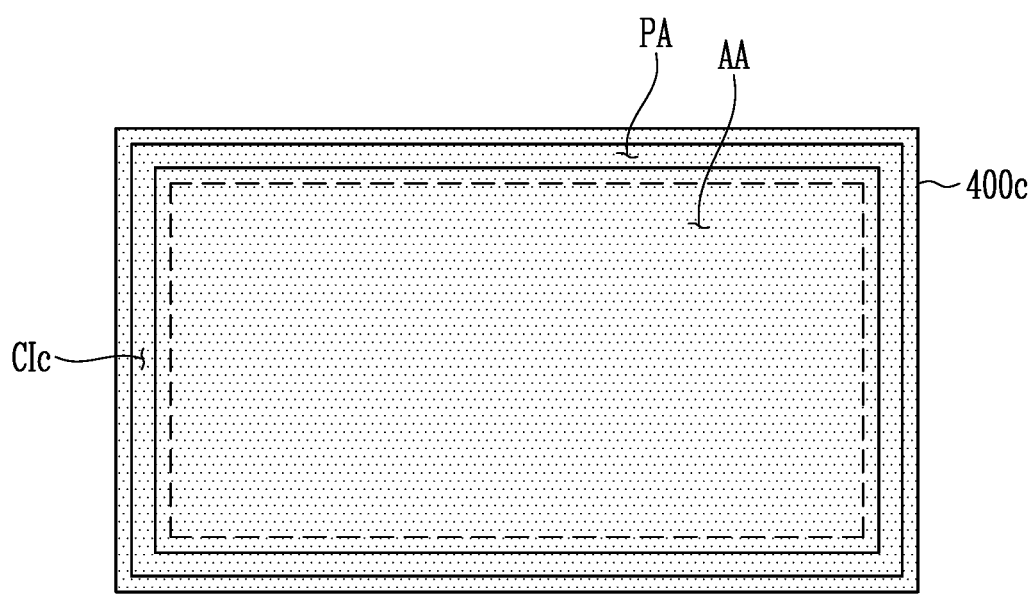
Figure 7C:
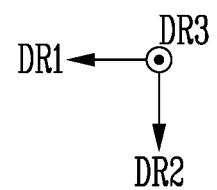

Subsequently, referring to FIG. 7C, a connection plate 400c may include a second contact interface CIc successively extending along the peripheral area PA. The second contact interface CIc may at least partially surround the active area AA. Accordingly, the connection plate 400c may be more effectively fixed to the display device 110.

Figure 7D:
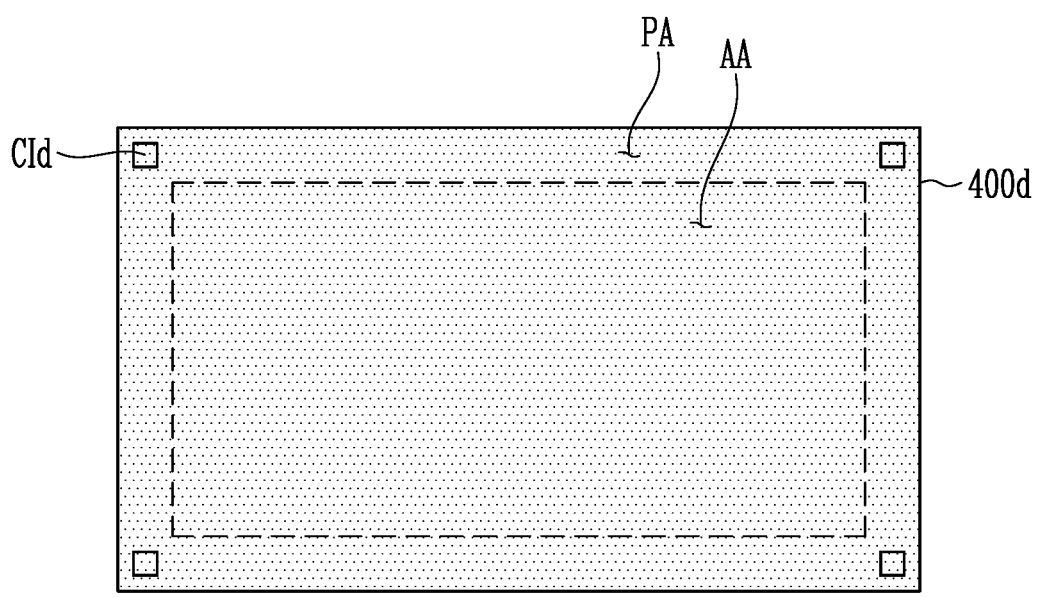

Referring to FIG. 7D, a connection plate 400d may include second contact interfaces CId in portions of the peripheral area PA adjacent to corners of the connection plate 400d.

As such, the connection plates 400a to 400d may include the second contact interfaces of various shapes and/or arrangements according to embodiments.

The above description with reference to FIGS. 7A and 7D may also be applied to the connection layer included in the liquid crystal lens device 120' of FIG. 1B. The liquid crystal lens device 120' may include the second contact interfaces as the connection layer on a lower surface thereof. At this time, the second contact interfaces of the liquid crystal lens device 120' may include the second contact interfaces CIa, CIb, CIc, and/or CId of FIGS. 7A, 7B, 7C, and 7D.

When the liquid crystal lens device 120 is aligned on the display device 110, a position of a lens (for example, any one of the first lenses LS1) of the liquid crystal lens device 120 relative to a position of the pixel of the display device 110 may be expressed as, for example, Equation 1 below.

$$\text{View} = \text{round}((x - \text{lens}_x)(\text{mod pitch}) \times vw)) \qquad \text{[Equation 1]}$$

In Equation 1, x may indicate a coordinate (for example, a coordinate of the first direction DR1) of the pixel of the display device 110, $\text{lens}_x$ may indicate a coordinate of a first lens (for example, a first lens disposed last in the first direction DR1 among the first lenses LS1) of the liquid crystal lens device 120, pitch may indicate a width of the first lens, vw may indicate the number of pixels (for example, 39) of the display device 110 at least partially overlapping one lens, and View may indicate a relative position of the lens of the liquid crystal lens device 120 corresponding to the pixel of the coordinate x.

As shown in Equation 1, View may be determined by performing a remaining operation mod on a value obtained by subtracting the coordinate $\text{lens}_x$ of the first lens from the coordinate x of the pixel and the width pitch of the lens, and multiplying a corresponding intermediate result value by vw. An operation round may be an operation that discards a decimal point. For example, a value obtained by multiplying the intermediate result value by vw may have a decimal point according to x and $\text{lens}_x$, and in this case, the decimal point may be discarded and the view may be determined.

After the liquid crystal lens device 120 is assembled and fixed to the display device 110, when an alignment error exists between the liquid crystal lens device 120 and the display device 110, an image output from the display device 110 through the liquid crystal lens device 120 may be distorted. In Equation 1 above, the relative position View of the lens of the liquid crystal lens device 120 corresponding to the pixel of the coordinate x may vary according to the alignment error.

Hereinafter, a method of processing image data to be displayed after the liquid crystal lens device 120 is connected to the display device 110 is described.

Figure 8:
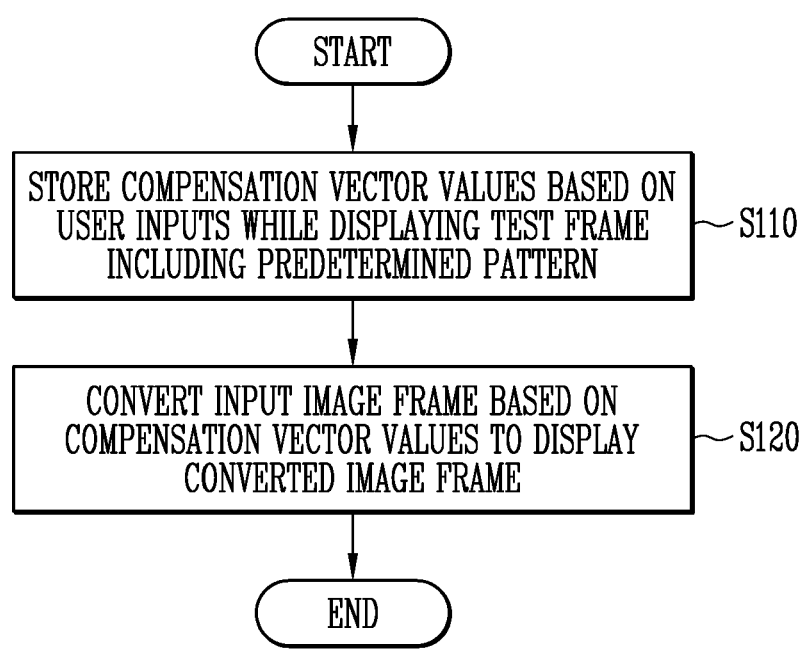
FIG. 8 is a flowchart illustrating an example of a method of operating the display device after the liquid crystal lens device is connected to the display device.

FIG. 8 is a flowchart illustrating an example of a method of operating the display device after the liquid crystal lens device is connected to the display device.

Referring to FIG. 8, in step S110, after the liquid crystal lens device 120 or 120' of FIG. 1A or 1B is connected to the display device 110, the display device 110 may determine compensation vector values for compensating for an alignment error between the liquid crystal lens device 120 or 120' and the display device 110 based on user inputs while displaying a test frame including a predetermined pattern.

In step S120, the display device 110 converts an image frame based on the determined compensation vector values and displays the converted image frame.

Hereinafter, for clear and concise description, a method of determining compensation vector values is described based on a case where the liquid crystal lens device 120 of FIG. 1A is connected to the display device 110. However, embodiments are not necessarily limited thereto. Also in a case where the liquid crystal lens device 120' of FIG. 1B is connected to the display device 110, compensation vector values may be determined in a similar method.

Figure 9:
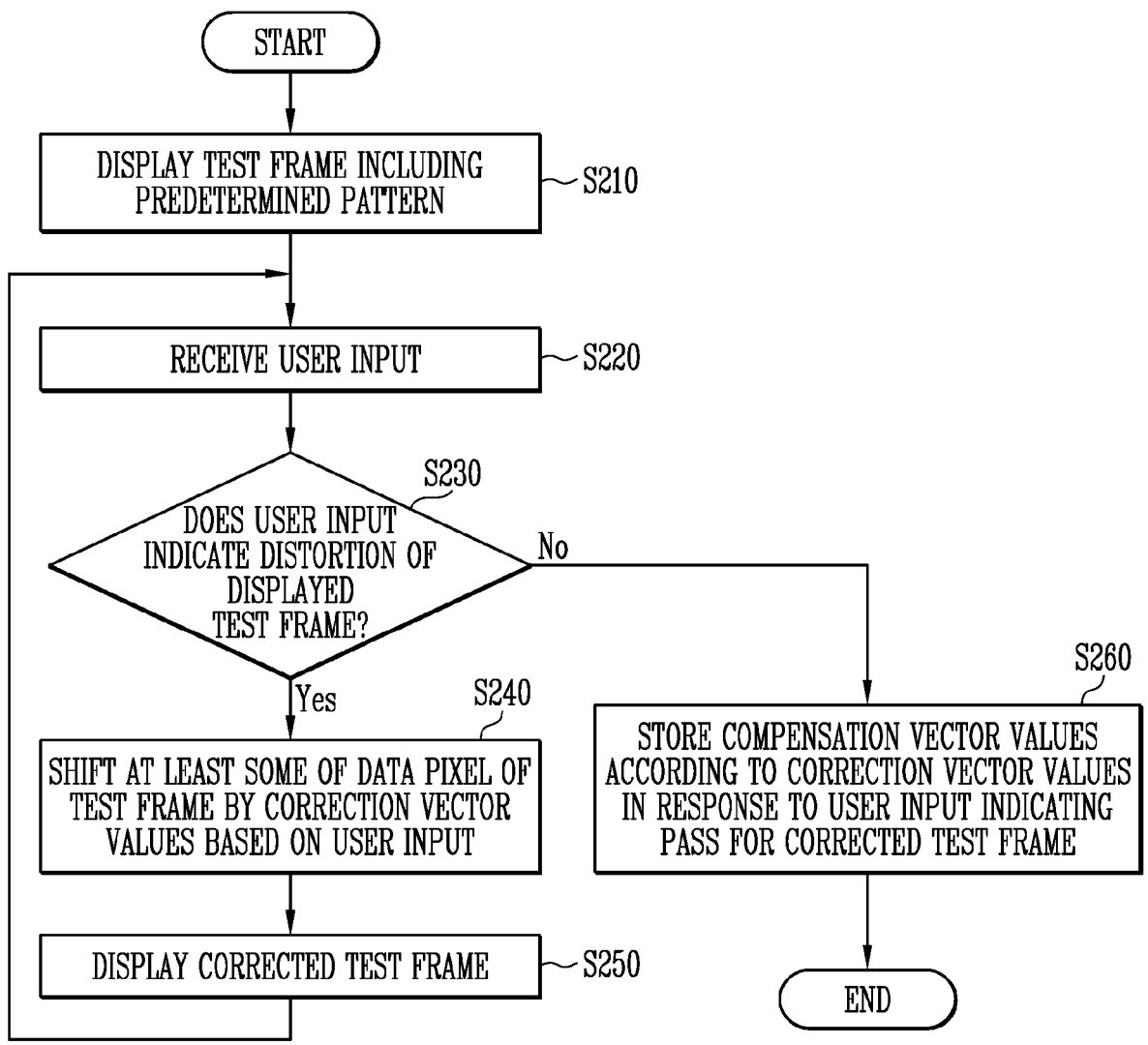
FIG. 9 is a flowchart illustrating an embodiment of step S110 of FIG. 8.
Figure 10:
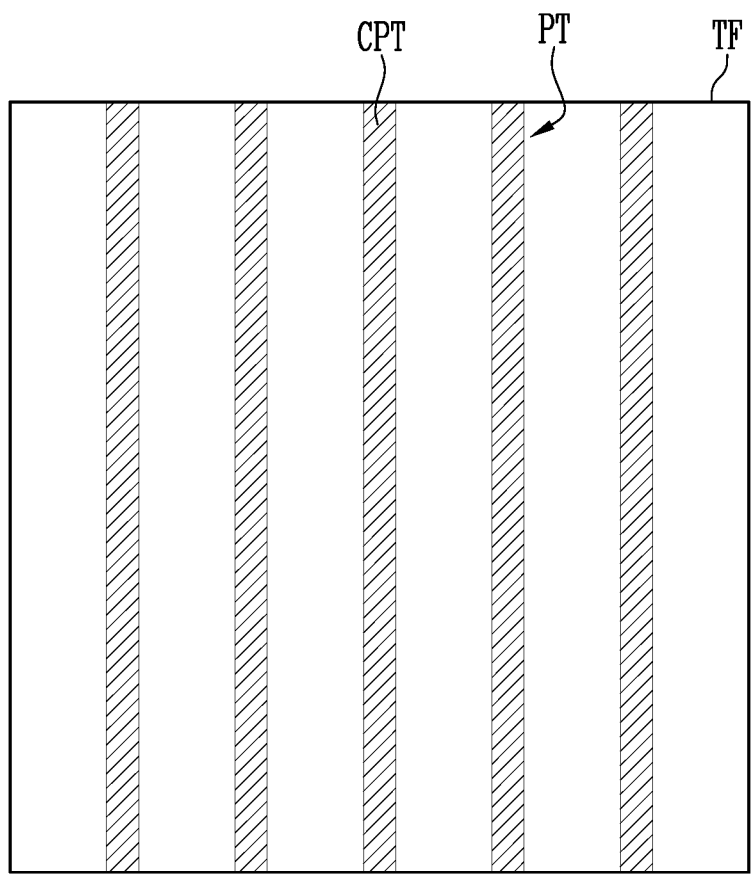
FIG. 10 is a diagram conceptually illustrating an example of a test frame used in step S210 of FIG. 9.
Figure 10:
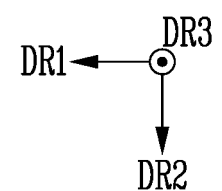
Figure 11:
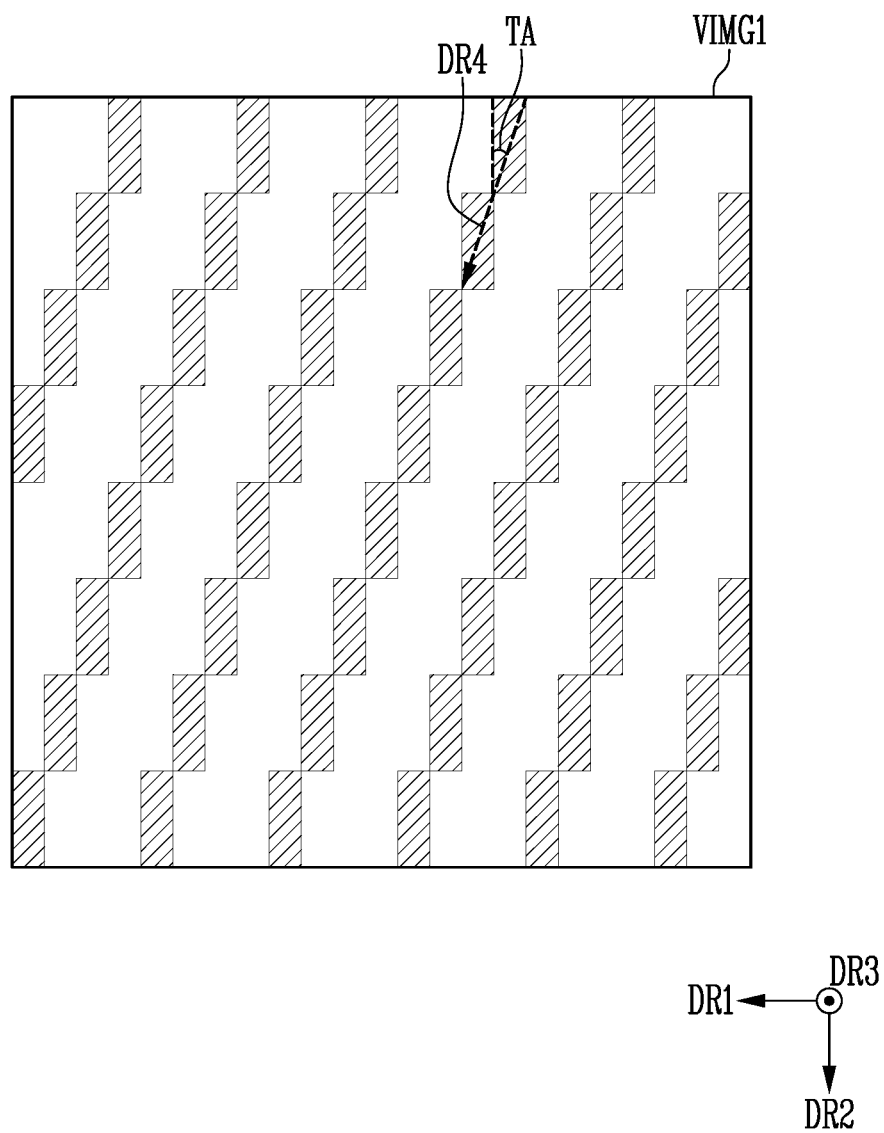
FIG. 11 is a diagram illustrating an example of an image shown to a user when the test frame of FIG. 10 is displayed by the display assembly.
Figure 12A:
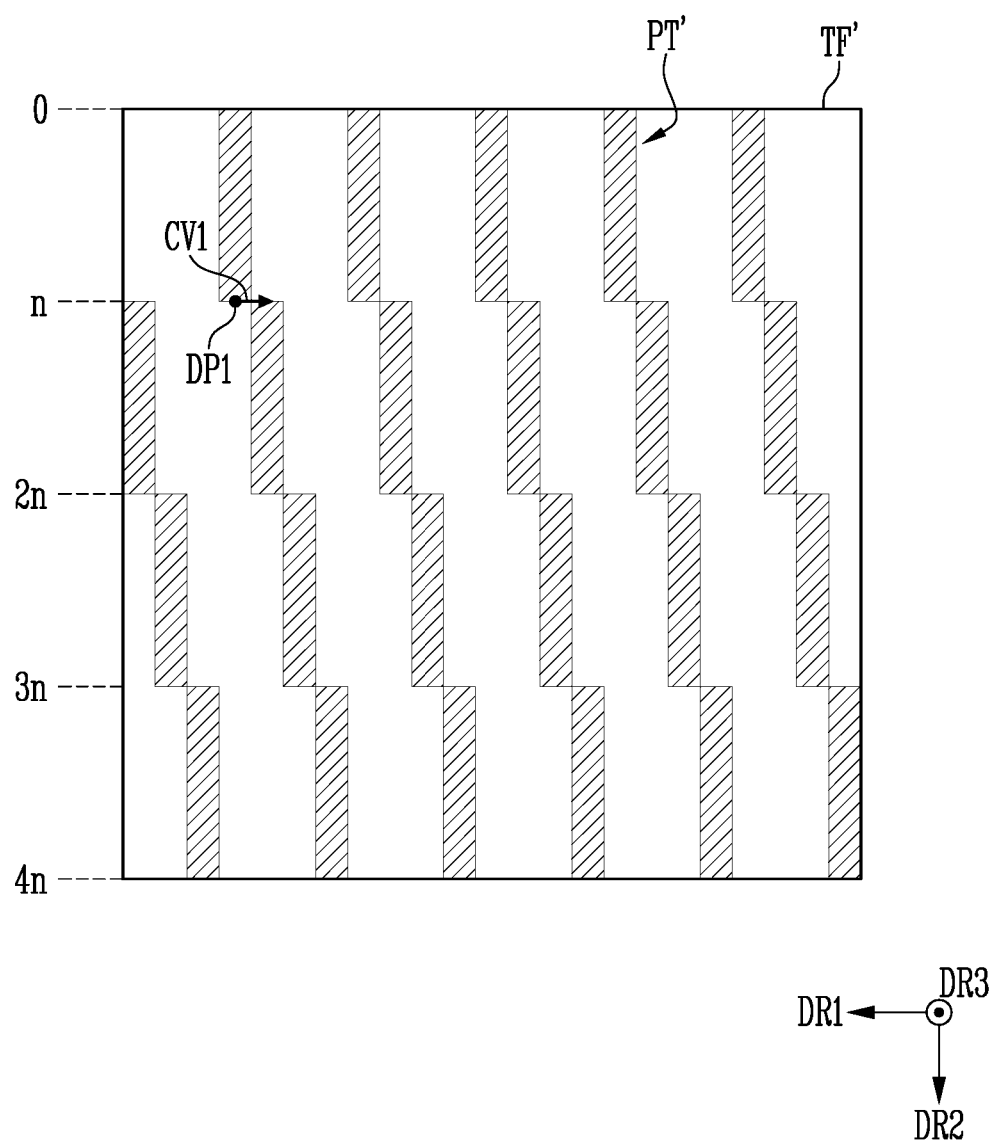
FIG. 12A is a diagram conceptually illustrating an example of a test frame corrected based on a user input after the test frame is displayed.
Figure 12B:
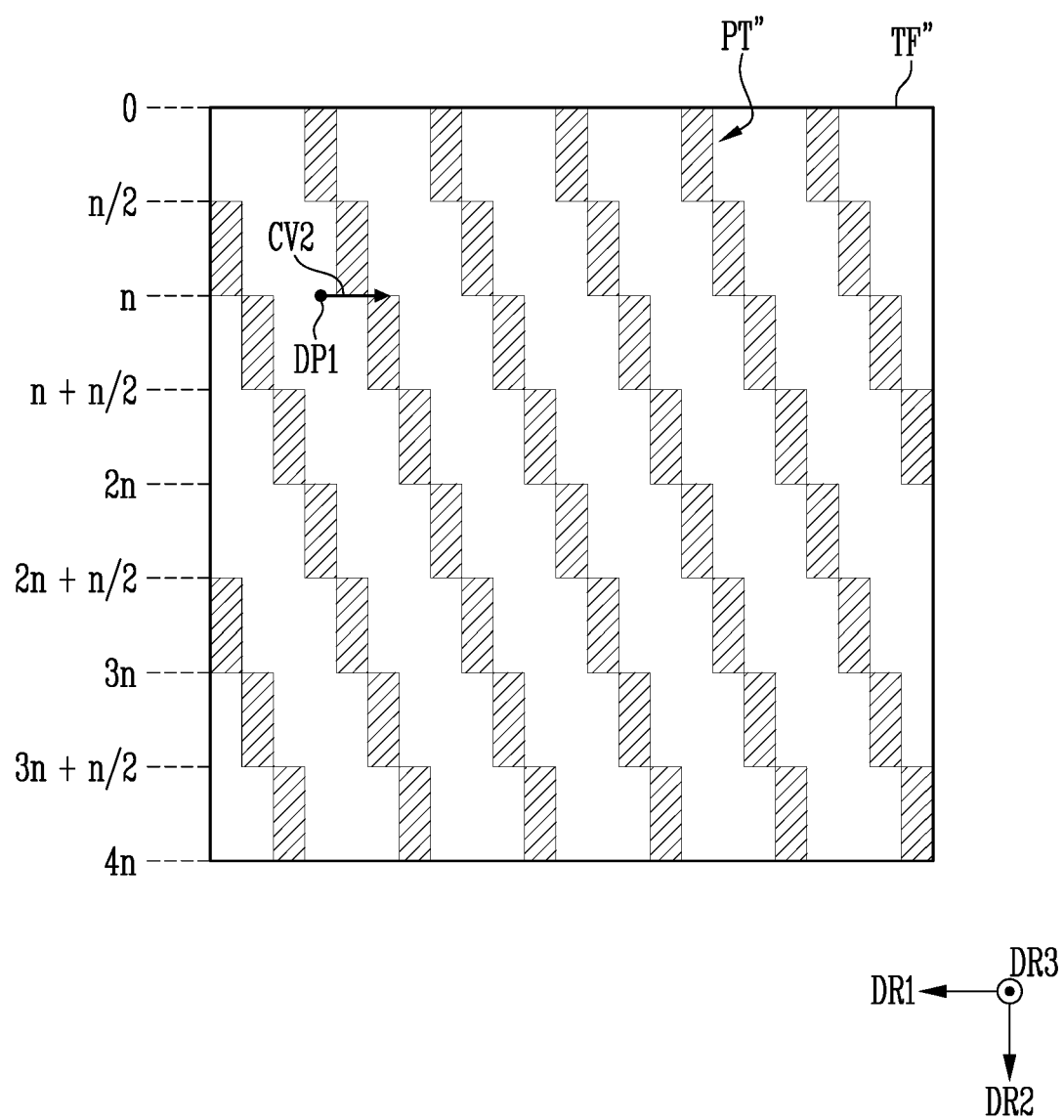
FIG. 12B is a diagram conceptually illustrating an example of a test frame re-corrected based on the user input after the corrected test frame of FIG. 12A is displayed.

FIG. 9 is a flowchart illustrating an embodiment of step S110 of FIG. 8. FIG. 10 is a diagram conceptually illustrating an example of a test frame used in step S210 of FIG. 9. FIG. 11 is a diagram illustrating an example of the image shown to the user when the test frame of FIG. 10 is displayed by the display assembly. FIG. 12A is a diagram conceptually illustrating an example of a test frame corrected based on a user input after the test frame is displayed. FIG. 12B is a diagram conceptually illustrating an example of a test frame re-corrected based on the user input after the corrected test frame of FIG. 12A is displayed.

Referring to FIGS. 1A and 9, in step S210, the display device 110 displays a test frame including a predetermined pattern. As shown in FIG. 10, a test frame TF may include patterns PT arranged in the first direction DR1 and extending in the second direction DR2.

When the liquid crystal lens device 120 is connected to the display device 110, the image output from the display device 110 passes through the liquid crystal lens device 120 and is shown to the user. Referring to FIG. 11, an image VIMG1 shown to the user may include patterns extending along a direction DR4 slanted in a clockwise direction by an angle TA with respect to the second direction DR2 differently from the patterns PT of FIG. 10.

As such, a slant of the patterns may occur due to the alignment error between the display device 110 and the liquid crystal lens device 120.

Referring to FIGS. 1A and 9 again, in step S220, the display device 110 receives the user input. In step S230, the display device 110 determines whether the user input indicates distortion of the displayed test frame. When the user input indicates distortion of the displayed test frame, step S240 is performed. When the user input indicates a pass for the displayed test frame, step S260 is performed.

In step S240, the display device 110 shifts at least some of data pixels of the test frame by correction vector values based on the user input. In FIG. 12A, any one DP1 of shifted data pixels is displayed. For example, after checking an image VIMG1 of FIG. 11, the user may provide a command for slanting a display image in a counterclockwise direction as the user input. In response to the user input, the display device 110 may shift each of the data pixels of the test frame TF, such as the first data pixel DP1, by a corresponding correction vector value CV1, to generate a corrected test frame TF' having patterns PT' slanted in a counterclockwise direction. For example, the display device 110 may determine k*CR as a size of the correction vector value CV1 with respect to data pixels from a (k*n)-th (k is a positive integer) row to a ((k+1)*n−1)-th row (CR is an arbitrary constant).

Referring to FIGS. 1A and 9 again, in step S250, the display device 110 may display the corrected test frame (for example, TF' of FIG. 12A). Thereafter, step S220 may be performed again.

When the user input indicates distortion of the displayed test frame in step S230, the correction vector value may be determined again in step S240. For example, the user input received again may include a command for slanting the display image in a counterclockwise direction. Referring to FIG. 12B, the first data pixel DP1 is shifted by a correction vector value CV2 of an increase size.

As such, the display device 110 may re-determine the correction vector value for each of the data pixels in response to the user input, and generate a re-corrected test frame TF'' having further slanted patterns PT'' by shifting the data pixels by the determined correction vector values. For example, the display device 110 may determine k*CR as a size of the correction vector value CV2 with respect to data pixels from a (k*(n/2))-th row to a ((k+1)*(n/2)−1)-th row.

As such, the correction vector value for each of the data pixels may be determined based on at least one user input.

In step S260, the display device 110 may determine the determined correction vector values as the compensation vector values in response to the user input indicating a pass for the corrected test frame.

Thereafter, as described with reference to FIG. 8, the display device 110 may convert (or correct) the image frame by applying the compensation vector values to the data pixels of the image frame, and display the converted image frame. Therefore, even though an alignment error exists between the display device 110 and the liquid crystal lens device 120, distortion of the display image may be minimized or at least reduced.

Figure 13:
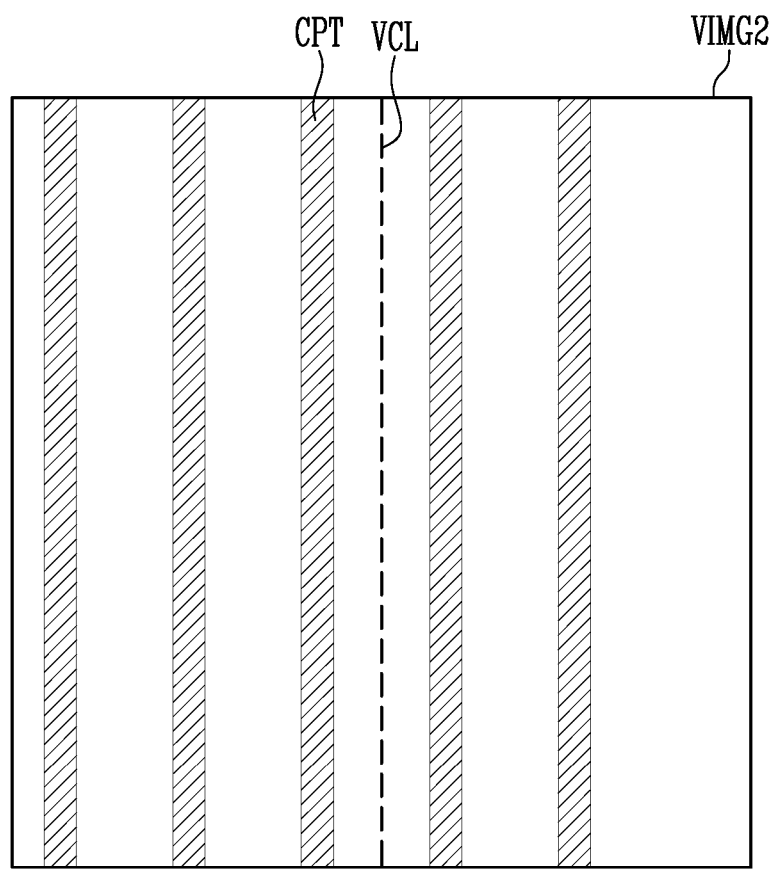
FIG. 13 is a diagram illustrating an example of the image shown to the user when the test frame of FIG. 10 is displayed by the display assembly.
Figure 13:
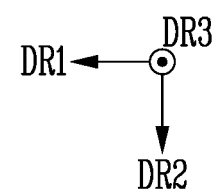
Figure 14:
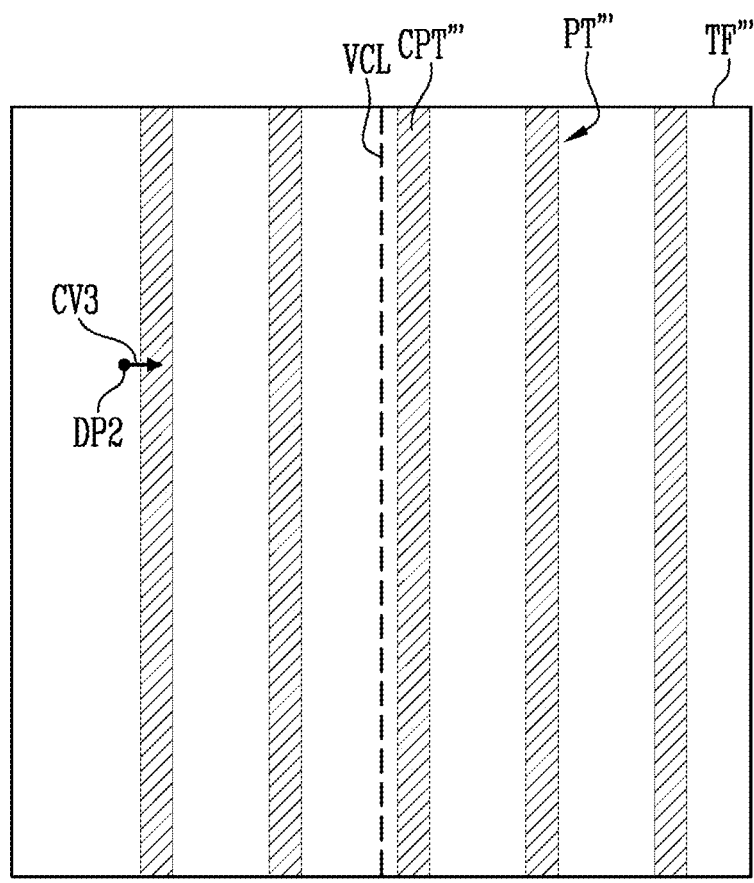
FIG. 14 is a diagram conceptually illustrating an example of the test frame corrected based on the user input after the test frame is displayed.
Figure 14:
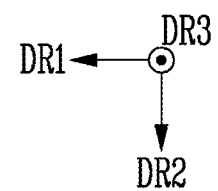

FIG. 13 is a diagram illustrating an example of the image shown to the user when the test frame of FIG. 10 is displayed by the display assembly. FIG. 14 is a diagram conceptually illustrating an example of the test frame corrected based on the user input after the test frame is displayed.

Referring to FIG. 13, an image VIMG2 shown to the user may include patterns shifted in a specific direction, for example, the first direction DR1, differently from the patterns PT of FIG. 10. For example, the patterns PT of the test frame TF of FIG. 10 may include a center pattern CPT disposed at a center of the test frame TF, and a color of the center pattern CPT may be different from that of other patterns. Accordingly, the user may easily recognize that the center pattern CPT is off center. For example, in FIG. 13, the center pattern CPT is out of a vertical center line VCL of the second direction DR2.

The user may provide a command for shifting the display image in a direction opposite to the first direction DR1 as the user input. The display device 110 may generate a corrected test frame TF''' by shifting the data pixels of the test frame TF, such as a second data pixel DP2 of FIG. 14, in the direction opposite to the first direction DR1 by a correction vector value CV3 based on the user input. For example, the display device 110 may define the same correction vector value CV3 for each of the data pixels of the test frame TF. As described with reference to FIG. 9, the correction vector value CV3 may be stored as the compensation vector value for each of the data pixels.

Figure 15:
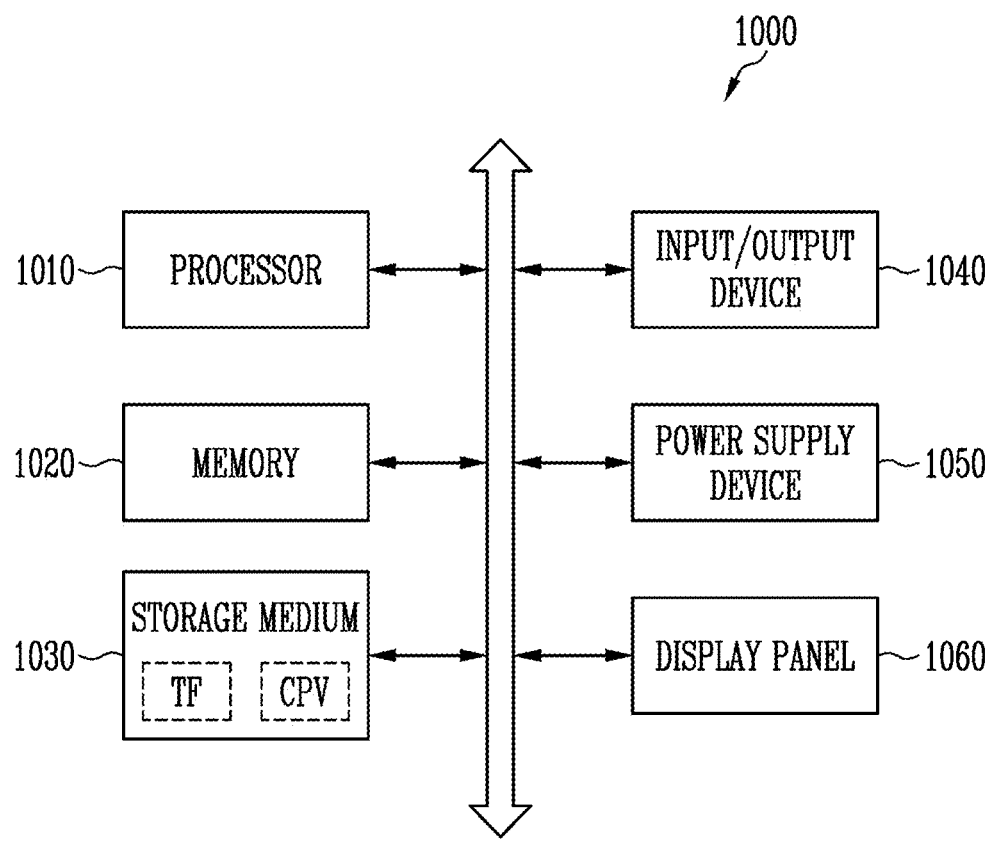
FIG. 15 is a block diagram illustrating an embodiment of a display device suitable for performing the method of FIG. 8.

FIG. 15 is a block diagram illustrating an embodiment of a display device suitable for performing the method of FIG. 8.

Referring to FIG. 15, the display device 1000 may include a processor 1010, a memory 1020, a storage medium 1030, an input/output device 1040, a power supply device 1050, and a display panel 1060. The display device 1000 may further include various ports for communicating with other devices such as a video card, a sound card, a memory card, and a USB device.

The processor 1010 may perform various tasks and calculations. In embodiments, the processor 1010 may include an application processor, a graphic processing unit, a microprocessor, a central processing unit (CPU), and the like. The processor 1010 may be connected to other components of the display device 1000 through a bus system. In embodiments, the bus system may include a peripheral component interconnect (PCI) bus.

The memory 1020 may be provided as a working memory and/or a buffer memory of the display device 1000 and/or the processor 1010. In embodiments, the memory 1020 may include volatile memory devices such as a dynamic random access memory (DRAM), a static random access memory (SRAM), and a mobile DRAM.

The processor 1010 may perform the operations described with reference to FIGS. 8 and 9. The processor 1010 may read the test frame TF described with reference to FIG. 10 from the storage medium 1030, display the read test frame TF on the display panel 1060, and determine the compensation vector values CPV based on the user inputs received through the input/output device 1040. The processor 1010 may store the determined compensation vector values CPV in the storage medium 1030. The processor 1010 may convert an image frame based on the compensation vector values CPV and display the converted image frame on the display panel 1060.

In embodiments, the display device 1000 may store an application program including program codes and/or commands for performing the above-described operations when the application program is executed by the processor 1010. In this case, the processor 1010 may perform the above-described operations by loading the application program from the storage medium 1030 into the memory 1020 and executing the loaded application program.

The storage medium 1030 may write data and read data in response to control of the processor 1010. The storage medium 1030 may include a nonvolatile storage medium maintaining data when power of the display device 1000 is cut off. In embodiments, the storage medium 1030 may include a solid state drive (SSD), a hard disk drive (HDD), and the like.

The input/output device 1040 may include devices receiving user inputs such as a keyboard, a keypad, a touch pad, a touch screen, and a mouse. The power supply device 1050 may supply power necessary for an operation of the display device 1000.

The display panel 1060 may display an image in response to the control of the processor 1010. The display panel 1060 may include a plurality of pixels like the display device 200 described with reference to FIG. 2, and displays an image through the plurality of pixels in response to the control of the processor 1010.

Components of the display device 1000 of FIG. 15 may be incorporated into the display device 110 of FIGS. 1A and 1B and may be assembled detachably from the liquid crystal lens device 120 or 120' of FIG. 1A or 1B.

In embodiments, the display device 1000 may be a computer device or another electronic device, such as a digital TV (digital television), a 3D TV, a personal computer (PC), a household electronic device, a notebook computer (laptop computer), a tablet computer, a mobile phone, a smart phone, a personal digital assistant (PDA), a portable multimedia player (PMP), a digital camera, a music player, a portable game console, or a vehicle navigation device.

Although the disclosure has been described with reference to the preferred embodiment above, those skilled in the art will understand that the disclosure may be variously modified and changed without departing from the spirit and technical area of the disclosure.

What is claimed is:

1. A display assembly, comprising:
    a display device having an upper surface through which an image is output; and
    a lens device detachably connected to the upper surface of the display device,
    wherein the lens device comprises:
        a lens panel configured to refract the image of the display device; and
        a connection layer disposed on a lower surface of the lens panel facing the display device and detachably connected to the upper surface of the display device,
    wherein the upper surface of the display device comprises first contact interfaces,
    wherein the connection layer comprises second contact interfaces that are detachably connected to the first contact interfaces,
    wherein the display device has a display area outputting the image and a non-display area at least partially surrounding the display area, and
    wherein the connection layer entirely contacts the upper surface of the display device without an air gap between the display device and the lens panel, in the display area.

2. The display assembly according to claim 1, wherein the display device has a display area outputting the image and a non-display area at least partially surrounding the display area, and
    wherein the lower surface of the lens panel and the connection layer entirely contact the upper surface of the display device without an air gap, in the display area.

3. The display assembly according to claim 1, wherein the second contact interfaces are magnetically connected to the first contact interfaces.

4. The display assembly according to claim 1, wherein the first contact interfaces include recesses disposed on the upper surface of the display device, and
    wherein the second contact interfaces include protrusions disposed on a lower surface of the connection layer facing the display device and received in the recesses, respectively.

5. The display assembly according to claim 1, wherein the first contact interfaces include protrusions disposed on the upper surface of the display device, and
    wherein the second contact interfaces include recesses disposed on a lower surface of the connection layer facing the display device and receiving the protrusions, respectively.

6. The display assembly according to claim 1, wherein the display device has a display area outputting the image and a non-display area at least partially surrounding the display area,
    wherein the first contact interfaces are disposed in the non-display area, and
    wherein the second contact interfaces at least partially overlaps the first contact interfaces.

7. The display assembly according to claim 1, wherein the display device is configured to store compensation vector values based on externally received user inputs, convert an input image frame based on the compensation vector values, and display the converted image frame.

8. The display assembly according to claim 1, wherein the display device is configured to display a first test frame including a predetermined pattern, and display a second test frame by shifting at least some of data pixels of the predetermined pattern by correction vector values in response to at least one first user input indicating that the displayed first test frame is distorted.

9. The display assembly according to claim 8, wherein the display device is configured to store compensation vector values according to the correction vector values, in response to a second user input indicating a pass for the displayed second test frame.

10. The display assembly according to claim 9, wherein the display device is configured to convert an input image frame based on the compensation vector values and display the converted image frame.

11. A display assembly, comprising:
a display device having an upper surface through which an image is output; and
a lens device detachably connected to the upper surface of the display device,
wherein the lens device comprises:
    a lens panel configured to refract the image of the display device; and
    a connection layer disposed on a lower surface of the lens panel facing the display device and detachably connected to the upper surface of the display device,
wherein the upper surface of the display device comprises first contact interfaces, and
wherein the connection layer comprises second contact interfaces that are detachably connected to the first contact interfaces,
wherein the lens panel further comprises:
a liquid crystal layer; and
a first lens array disposed between the liquid crystal layer and the connection layer, and
wherein the connection layer has a substantially same refractive index as that of the first lens array.

12. The display assembly according to claim 11, wherein the lens panel further comprises a second lens array, wherein the liquid crystal layer is disposed between the first lens array and the second lens array, and
wherein the second lens array has a refractive index that is different from that of the first lens array.

13. A display assembly, comprising:
a display device having an upper surface through which an image is output; and
a lens device detachably connected to the upper surface of the display device,
wherein the lens device comprises:
    a lens panel configured to refract the image of the display device; and
    a connection layer disposed on a lower surface of the lens panel facing the display device and detachably connected to the upper surface of the display device,
wherein the upper surface of the display device comprises first contact interfaces,
wherein the connection layer comprises second contact interfaces that are detachably connected to the first contact interfaces,
wherein the display device has a display area outputting the image and a non-display area at least partially surrounding the display area, and includes a plurality of pixels arranged in a first direction and a second direction crossing the first direction in the display area,
wherein the lens panel has an active area at least partially overlapping the display area and a peripheral area at least partially surrounding the active area and at least partially overlapping the non-display area, and
wherein the lens panel comprises a lens array having lenses extending in a direction slanted at an acute angle with respect to the second direction in the active area.

14. The display assembly according to claim 13, wherein the second contact interfaces of the connection layer at least partially overlap portions of the peripheral area spaced apart from the lens array in the first direction.

15. The display assembly according to claim 14, wherein the second contact interfaces of the connection layer at least partially overlap portions of the peripheral area spaced apart from the lens array in the second direction.

* * * * *